(12) United States Patent
Liu et al.

(10) Patent No.: US 10,601,614 B1
(45) Date of Patent: Mar. 24, 2020

(54) METHODS, APPARATUS, AND SYSTEMS TO INCREASE COMMON-MODE TRANSIENT IMMUNITY IN ISOLATION DEVICES

(71) Applicant: Texas Instruments Incorporated, Dallas, TX (US)

(72) Inventors: Zhidong Liu, Cary, NC (US); James Michael Walden, Apex, NC (US); Satish Kumar Vemuri, Raleigh, NC (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/425,536

(22) Filed: May 29, 2019

Related U.S. Application Data

(60) Provisional application No. 62/735,337, filed on Sep. 24, 2018.

(51) Int. Cl.
| | | |
|---|---|---|
| *H04L 25/02* | (2006.01) | |
| *H01L 29/78* | (2006.01) | |
| *H04L 27/227* | (2006.01) | |
| *G05F 3/26* | (2006.01) | |
| *H04B 1/04* | (2006.01) | |
| (Continued) | | |

(52) U.S. Cl.
CPC .......... *H04L 25/0276* (2013.01); *G05F 3/262* (2013.01); *H01L 29/78* (2013.01); *H03K 7/06* (2013.01); *H04B 1/0475* (2013.01); *H04L 25/0266* (2013.01); *H04L 25/0268* (2013.01);
(Continued)

(58) Field of Classification Search
CPC ............. H04L 25/0266; H04L 25/0276; H04L 27/2275; H04L 25/0268; H04L 25/069; H04L 1/0061; H04L 29/78; H03D 3/00; H01F 2019/085; H02M 3/33523; H02M 3/33553; H04B 1/0475; H04B 2001/0408; H04B 2001/045; H04B 1/10;
(Continued)

(56) References Cited

U.S. PATENT DOCUMENTS 8,581,627 B2 * 11/2013 Panov ............ H03K 19/018521
326/80
8,693,528 B1 * 4/2014 Shrestha ............. H04L 25/0276
375/219
(Continued)

OTHER PUBLICATIONS

Chen, "Optocouplers Help Promote Safe, Efficient EV Charging Stations," Electronic Design, published Jan. 28, 2016, 12 pages.

*Primary Examiner* — Vibol Tan
(74) *Attorney, Agent, or Firm* — Tuenlap Chan; Charles A. Brill; Frank D. Cimino

(57) ABSTRACT

Methods, systems, and apparatus to increase common-mode transient immunity in isolation devices is disclosed. An example apparatus includes a current mirror including an input terminal and an output terminal; a transistor including a gate terminal, a first current terminal, and a second current terminal, the gate terminal coupled to a reference voltage terminal, the first current terminal coupled to the input terminal of the current mirror, and the second current terminal coupled to an input node; a buffer including an input terminal and an output terminal, the input terminal of the buffer coupled to the output terminal of the current mirror; and a logic gate including an input terminal and an output terminal, the input terminal of the logic gate coupled to the output terminal of the buffer.

26 Claims, 13 Drawing Sheets

(51) Int. Cl.
*H04L 25/06* (2006.01)
*H03K 7/06* (2006.01)

(52) U.S. Cl.
CPC ........ *H04L 25/069* (2013.01); *H04L 27/2275* (2013.01)

(58) Field of Classification Search
CPC ....... H03K 17/08104; H03K 17/08122; H03K 5/2481; Y02B 70/1475; G05F 3/262
See application file for complete search history.

(56) References Cited

U.S. PATENT DOCUMENTS

| | | | | |
|---|---|---|---|---|
| 8,737,541 | B2 * | 5/2014 | Tanaka | H03M 13/451 |
| | | | | 375/267 |
| 9,379,746 | B2 * | 6/2016 | Kramer | H04B 1/0475 |
| 9,621,383 | B1 * | 4/2017 | Urienza | H04L 25/0266 |
| 9,634,646 | B1 * | 4/2017 | Ha | H04L 25/12 |
| 9,698,728 | B2 * | 7/2017 | Kamath | H03D 3/00 |
| 9,866,126 | B2 * | 1/2018 | Sato | H02M 3/33546 |
| 9,973,220 | B2 * | 5/2018 | Kramer | H04B 1/0475 |
| 10,038,403 | B2 * | 7/2018 | Kamath | H04L 25/0268 |
| 10,193,581 | B2 * | 1/2019 | Ragonese | H03F 3/45632 |
| 10,200,076 | B1 * | 2/2019 | Choi | H04L 5/1461 |
| 10,236,878 | B1 * | 3/2019 | Chen | H03K 17/689 |

\* cited by examiner

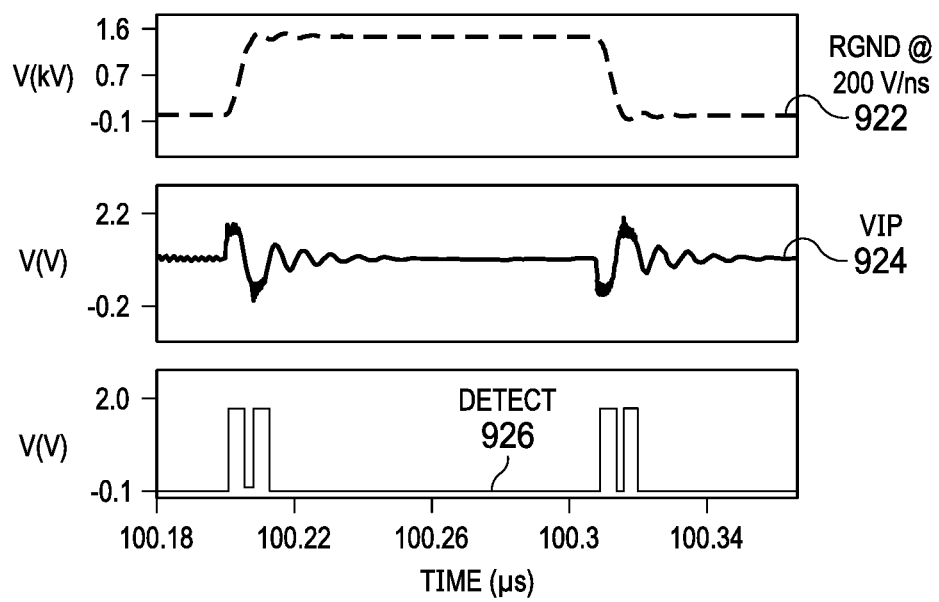
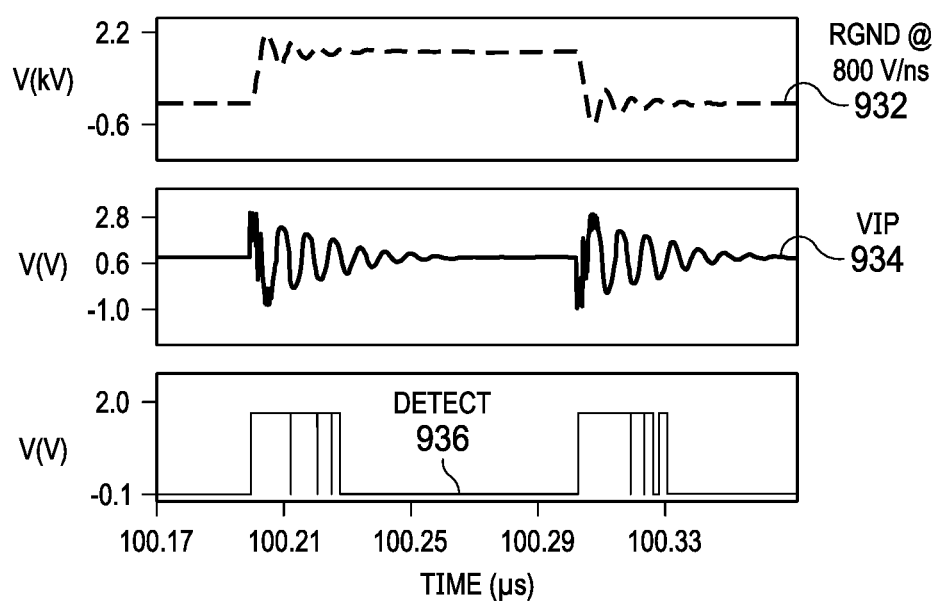

METHODS, APPARATUS, AND SYSTEMS TO INCREASE COMMON-MODE TRANSIENT IMMUNITY IN ISOLATION DEVICES

RELATED APPLICATION

This patent claims the benefit of U.S. Provisional Patent Application Ser. No. 62/735,337, which was filed on Sep. 24, 2018. U.S. Provisional Patent Application Ser. No. 62/735,337 is hereby incorporated herein by reference in its entirety.

FIELD OF THE DISCLOSURE

This disclosure relates generally to isolation devices and, more particularly, to methods, apparatus, and systems to increase common-mode transient immunity in isolation devices.

BACKGROUND

An isolation device allows signals to be transmitted between first and second parts of a circuit while the first and second parts are not connected ohmically. An isolation device includes an isolation layer implemented with, for example, a capacitive isolation barrier, an inductive isolation barrier, an optocoupled isolation barrier, and/or any other suitable isolation barrier. An isolation device may be used to protect low-voltage sections of a circuit from high-voltage sections of a circuit while allowing communication (e.g., transmission of signals) between the two sections.

SUMMARY

Certain examples disclosed herein increase common-mode transient immunity in isolation devices. An example system includes a current mirror including an input terminal and an output terminal; a transistor including a gate terminal, a first current terminal, and a second current terminal, the gate terminal coupled to a voltage source, the first current terminal coupled to the input terminal of the current mirror, and the second current terminal coupled to an input node; a comparator including an input terminal and an output terminal, the input terminal of the comparator coupled to the output terminal of the current mirror; and a logic gate including an input terminal and an output terminal, the input terminal of the logic gate coupled to the output terminal of the comparator.

BRIEF DESCRIPTION OF THE DRAWINGS

FIGS. 9A-9E are timing diagrams representative of outputs of the example receiver of FIG. 1 in response to a common-mode transient event.

Figure 1:
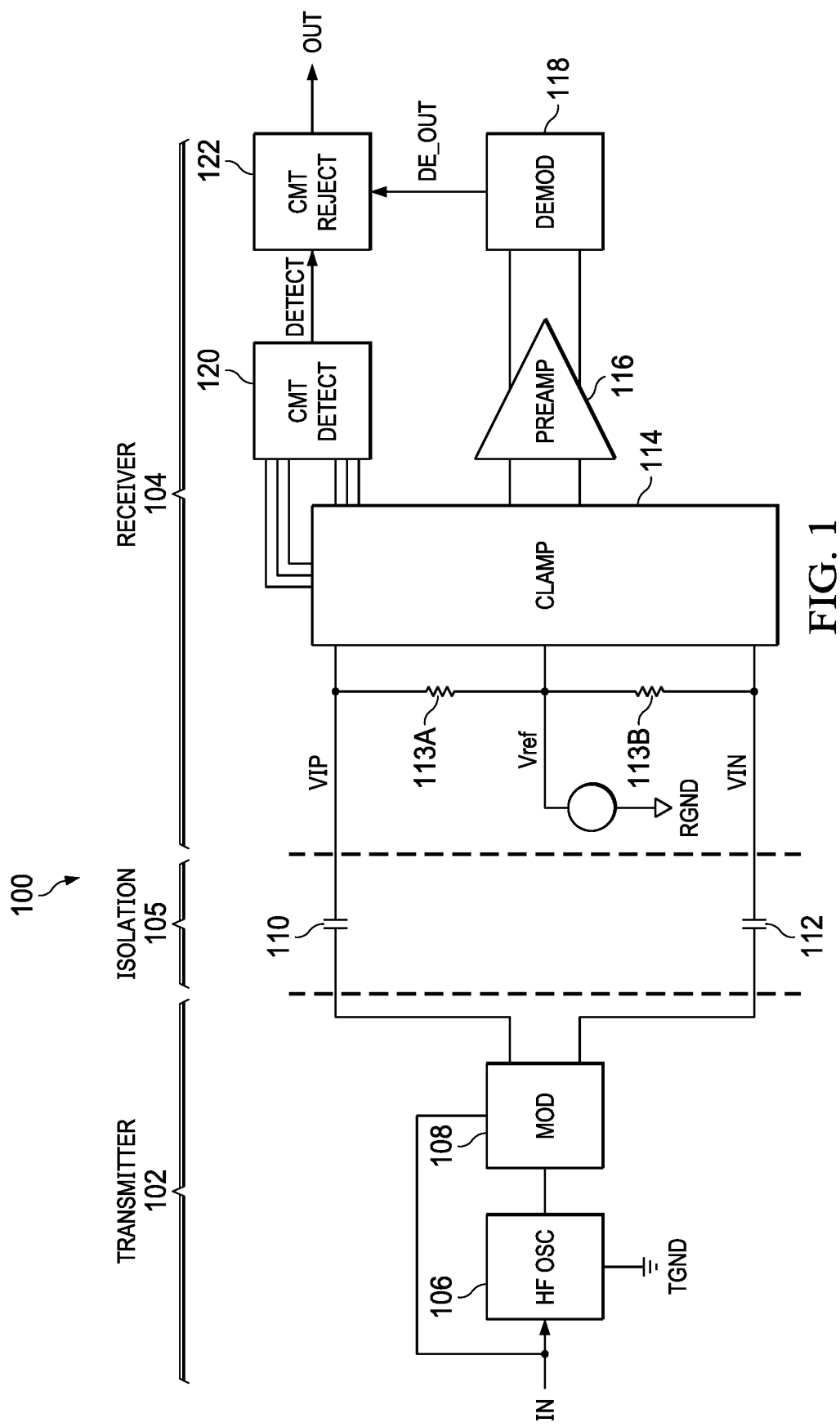
FIG. 1 illustrates an example transmitter coupled to an example receiver via an isolation channel in conjunction with examples disclosed herein.

The figures are not to scale. Wherever possible, the same reference numbers will be used throughout the drawing(s) and accompanying written description to refer to the same or like parts. As used herein, coupled and/or connected include both direct and indirect coupling and/or connections. For example, a first device coupled to a second device includes the first device being directly coupled and/or connected to the second device or indirectly coupled and/or connected to the second device (e.g., with one or more component being coupled between the first and second deices).

Descriptors "input," "output," "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

Isolation devices (e.g., galvanic isolation devices) are used in a variety of systems to ohmically isolate two or more parts of the system while allowing the two parts of the system to communicate (e.g., for signal transfer and/or power transfer operations). For example, isolation devices may be used as isolated gate drivers to control high-voltage power switches (e.g., metal oxide semiconductor field effect transistors (MOSFETs), insulated-gate bipolar transistors (IGBTs), gallium nitride (GaN) transistors, silicon carbide (SiC) transistors, etc.) in various environments and applications. In this manner, a controller at a lower voltage part of the system can transmit control signals to a higher voltage part of the system to control a high-voltage power switch while being protected from the high voltages of the high-power side. Likewise, the higher voltage part of the system can transmit feedback signals to the controller without damaging the lower voltage part of the system. Isolation devices may be used in one or more power supply systems of traction inverters in an electric vehicle (EV), charging stations for EV, inverters in a hybrid-electric vehicle (HEV), solar inverters, telecom systems, network power systems, and etc.

High-voltage isolation devices transfer signals through isolation barriers. For example, the signal may be transferred using a modulated carrier wave across a 5 k rms voltage (Vrms) or more isolation barrier for reinforce applications and/or across a 2.5 k Vrms or more isolation barrier for basic isolation applications. Isolation barriers may be implemented by capacitive isolation technology, inductive isolation technology, optocoupled isolation technology, or any other suitable isolation technology to facilitate signal and/or power transfer between two parts of a system. For example, an isolation device may include a transmitter transmitting differential signals (e.g., modulated carrier signals) across the capacitive isolation barrier, and a receiver receiving the transmitted differential signals. As used herein a carrier wave and/or carrier signal refers to a modulated signal (e.g., a modulated sinusoidal signal, a modulated square wave signal, etc.) carrying a message at a certain frequency (e.g., 10 GHz). The differential signals may then be demodulated by a receiver to retrieve the message.

Implementing an isolation device separates two stages (e.g., parts) of a system (e.g., a low-voltage stage and a high-voltage stage) so that if an electrical fault occurs in one stage of the system, the fault will not affect the other stage of the system. The two stages have separate electrical grounds. Thus, the ground voltages for the two stages may be different. For example, the low-voltage stage of an isolation device may be referenced to as a first ground and the high-voltage stage of the isolation device may be referenced to as a second ground that is different than the first ground. The difference between the two ground voltages may be referred to as a common-mode voltage. An isolation device can operate with each part referenced to a different ground without substantial noise while the difference between the two ground voltages is not changing (e.g., the difference between the two ground voltages remain substantially stable).

If one of the ground voltages changes, the common-mode voltage may change. The change in the common-mode voltage is known as a common-mode transient (CMT) event that may introduce noise at the receiver. If the change of one of the ground voltages has a high slew rate (e.g., a high voltage differential change over time), the noise caused by the CMT event may trigger a positive and/or negative voltage spike(s) in the carrier signal(s) that is transmitted to the receiver through the isolation barrier. If the magnitude of the voltage spike is large enough, the spike will affect the amplification of the one or more carrier signals, thereby affecting the demodulation of the one or more signals. For example, when the demodulator receives an amplified voltage spike, the demodulator may incorrectly demodulate the carrier signal(s) causing one or more glitches to the demodulator output. A glitch is an incorrect and/or unintended demodulator output. Accordingly, when experiencing a CMT event, the demodulator may output false pulses (e.g., an inaccurate representation of data) at the output of the receiver.

For example, when the transmitter of an isolation device transmits one or more carrier signals corresponding to a logic value of '1' to the receiver via the isolation barrier, the receiver receives the one or more carrier signals and demodulates the carrier signals to determine that the transmitted value is a logic value of '1' and outputs the logic value of 1.' However, during a CMT event, a negative voltage spike may be transmitted through the isolation barrier with the one or more carrier signals. Accordingly, during a CMT event, even though the carrier signals generated by the transmitter correspond to a logic value of '1,' the negative voltage spike caused by the CMT event may cause the receiver to output an inaccurate logic value of '0.'

Isolation devices include a CMT immunity (CMTI) attribute. The CMTI attribute is the maximum tolerable rate of rise or fall of one of the grounds during a CMT event that will not trigger a glitch at the output of the receiver. Accordingly, the higher the CMTI attribute of an isolation device, the more resilient the isolation device is to noise cause by CMT events and/or other factors. Some techniques for increasing CMTI include an optimization of isolation signal path and/or CMT noise filtering. However, using such techniques, the signal-to-noise ratio of the receiver may be degraded under certain input signal amplitudes, which limit CMTI performance. Other techniques for increasing CMTI include utilizing a glitch filter after the demodulation to minimize false output glitches caused by a CMT event. However, a glitch filter introduces propagation delay, which may be undesirable for high-speed applications.

Examples disclosed herein provide a common-mode transient detection circuit (CMT detection circuit) and a common-mode transient circuit rejection circuit (CMT rejection circuit) in parallel with the amplifier and demodulator to provide CMTI for CMT events occurring at any slew rate without the added propagation delay and/or signal-to-noise ratio degradation of the above-techniques.

FIG. 1 illustrates an example isolation circuit 100 including a transmitter side, an isolation barrier, and a receiver side. The transmitter side includes an example transmitter 102 coupled to an example receiver 104 of the receiver side via an example isolation barrier 105. The example transmitter 102 of FIG. 1 includes an example high frequency oscillator 106, and an example modulator 108. The example receiver 104 of FIG. 1 includes an example clamp 114, an example preamplifier 116, an example demodulator 118, an example CMT detection circuit 120, and an example CMT rejection circuit 122. The isolation barrier 105 of FIG. 1 includes one or more of the example capacitors 110, 112. In some examples, the isolation barrier 105 may be included with the transmitter 102 and/or the receiver 104. The example CMT detection circuit 120 and the example CMT rejection circuit 122 are connected in parallel to the example preamplifier 116 and the example demodulator 118.

The example isolation circuit 100 of FIG. 1 enables signal and/or power transfer between two parts of a system while preventing transfer of DC and unwanted AC between two parts of the system. For example, the transmitter 102 can transmit one or more carrier signals corresponding to a control signal to the receiver 104 via the isolation barrier 105. The receiver 104 demodulates the carrier signals to determine the control signal and transmits the control signal to a component (e.g., a high-voltage power switch). However, because the isolation barrier 105 ohmically decouples the transmitter 102 from the receiver 104, there is no transfer of DC. In the example of FIG. 1, the transmitter 102 is implemented in a first die, and the receiver 104 is implemented in a second die. Each die may include a capacitor, such that when the two dies are packed together as the isolation circuit 100 in a single package, the two capacitors are coupled in series. Alternatively, the example isolation circuit 100 may be implemented as a single chip and/or die (e.g., a single silicon substrate).

The example transmitter 102 of FIG. 1 converts an input signal into two out-of-phase small signal carriers representative of the input signal. For example, the high frequency oscillator 106 receives the input value as part of an input signal (e.g., a control signal, a PWM signal, etc.) and converts the input value into a high frequency modulated carrier signal representative of the input signal. In some example, the high frequency oscillator 106 outputs a 500 megahertz (MHz) signal (e.g., a 500 MHz sinusoidal signal, a 500 MHz square signal, etc.). The example modulator 108 receives the high frequency output from the example oscillator 106 and converts the high frequency signal into two small amplitude modulated signal carriers representative of the input data. For example, the modulator 108 may modulate (e.g., convert) signals using an on-off keying (OOK) based modulation scheme and/or any other modulation scheme. The two small amplitude signal carriers are out of phase carrier signals that represent the input data. For example, the modulator 108 may output the two out of phase carrier signals for a preset duration of time when the input data is a '1' and the modulator 108 may output a 0V AC signal for the preset duration of time when the input data is a '0.' In this manner, when the example receiver 104 receives the carrier signals (e.g., from the outputs of the modulator 108 via the example capacitors 110, 112), the receiver 104 can demodulate the carrier signals to identify the input data of '1' and when the receiver 104 does not receive the carrier signals (e.g., corresponding to a 0V AC signal), the receiver 104 can demodulate the 0V AC signal to identify the input data of '0.'

The example capacitors 110, 112 of FIG. 1 allow the carrier signal outputs of the example modulator 108 to be transmitted from the transmitter 102 to the example receiver 104 (e.g., at the Vip node and the Vin node of the receiver 104). Additionally, the example capacitors 110, 112 isolate (e.g., separate) a first stage (e.g., a low-voltage stage) of a system coupled to the input of the transmitter 102 to a second stage (e.g., a high-voltage stage) of the system coupled to the output of the receiver 104. However, because the isolation barrier 105 provides AC coupling, the modulated signal carriers pass through the example capacitor 110, 112 to the receiver 104. In some examples, the capacitor 110, 112 may be implemented as multiple capacitors. For example, the capacitor 110 may be two capacitors (e.g., a first capacitor for the transmitter 102 and a second capacitor for the receiver 104) and the capacitor 112 may be two capacitors (e.g., a first capacitor for the transmitter 102 and a second capacitor for the receiver 104). Although the isolation layer of FIG. 1 is implemented by the example capacitors 110, 112, the isolation layer may be implemented as an inductive isolation barrier, an optocoupled isolation barrier, or any other suitable isolation barrier.

The example receiver 104 of FIG. 1 receives the carrier signals from the example transmitter 102 via the example capacitors 110, 112. The carrier signals are defined by a voltage drop across the respective example resistors 113a, 113b to the receiver reference voltage source Vref (e.g., 1V). As used herein, the node Vref has a voltage potential that corresponds to the voltage source Vref (e.g., 1V). The example receiver 104 converts the received carrier signals into an CMT glitch free output that corresponding to the input of the example transmitter 102.

Once the carrier signals (e.g., defined by the voltage across the example resistors 113a, 113b) are passed from the transmitter 102 through the capacitor 110, 112, the example clamp 114 of FIG. 1 clamps any voltage above a first threshold and/or any voltage below a second threshold. During normal operation, the voltage at the nodes Vip, Vin should not go above or below the thresholds, because the carrier signal is designed to not go above or below a particular amplitude. However, during a common-mode transient (e.g., when the ground of the transmitter 102 (TGND) transitions from a first voltage to a second voltage), the common-mode transient may cause a voltage spike to occur at the outputs of the modulator 108. The voltage spike passes through the example capacitors 110, 112 and may, if large enough, reach a voltage higher than a maximum threshold voltage or lower than a minimum threshold voltage. Such a spike may cause damage to the components of the receiver 104 and/or components coupled to (e.g., directly or indirectly) the output of the example receiver 104. Accordingly, the example clamp 114, prevents the voltage at the Vip input node and/or the Vin input node from being higher than a maximum threshold or lower than a minimum threshold. A circuit implementation of the example clamp 114 is further described below in conjunction with FIG. 2.

The example preamplifier 116 of FIG. 1 is coupled to the example clamp 114. The example preamplifier 116 amplifies the carrier signals (e.g., which may be clamped if above and/or below a threshold) from the example transmitter 102. Because the carrier signals have a small amplitude, the example preamplifier 116 amplifies the small amplitude to a larger amplitude so that the example demodulator 118 can properly demodulate the amplified carrier signals. The outputs of the example preamplifier 116 are coupled to the example demodulator 118. The example demodulator 118 demodulates the amplified carrier signals to generate a demodulator output corresponding to input of the example transmitter 102. However, when a CMT event occurs (e.g., as a result of the TGND and/or RGND changing at a high slew rate), ringing (e.g., spikes) can occur in the carrier signal causing glitches in the output of the example demodulator 118. Accordingly, the demodulator output of the demodulator 118 (e.g., the demodulator output terminal) may inaccurately demodulate the input of the example transmitter 102, such that the demodulator output may include the unintended glitches. As further described below, the output of the example demodulator 118 is coupled to the example CMT rejection circuit 122 so that the example CMT rejection circuit 122 can reject any glitches that may be included in the output of the example demodulator 118.

The example CMT detection circuit 120 of FIG. 1 is coupled to node(s) of the example clamp 114. The example CMT detection circuit 120 detects when a CMT event occurs by sensing the current through switch(es) (e.g., transistors, diodes, etc.) in the example clamp 114. For example, when the example clamp 114 clamps a voltage spike, one or more transistors turn on to prevent the voltage at Vip for exceeded a threshold voltage corresponding to the threshold voltage and/or the gate to source voltage of the one or more transistors. In such an example, when the one or more transistors turn(s) on, current flows from a first current terminal (e.g., the drain) to a second current terminal (e.g., the source) of the transistor and/or from the source to the drain of the transistor. As used herein, a current terminal can be a source and/or drain of a transistor or an input and/or an output of a switch. The example CMT detection circuit 120 senses the current corresponding to the drain-to-source current and/or source-to-drain current. When the sensed current is above a predefined threshold, the CMT detection circuit 120 determines that a CMT event is occurring and outputs a voltage representative of the CMT event (e.g., an active high detect signal) to the example CMT rejection circuit 122. In this manner, the CMT rejection circuit 122 can temporarily maintain the output of the demodulator 118 when the CMT event is detected and block the output of the demodulator 118 from being delivered as an output for a duration of time, so as to prevent glitches at the output of the receiver 104. A circuit implementation of the example CMT detection circuit 120 is further described below in conjunction with FIG. 2.

The example CMT rejection circuit 122 of FIG. 1 is coupled to the output of the example CMT detection circuit and the output of the example demodulation 118. When output of the example CMT detection circuit 120 is at a voltage representative of no CMT event occurring (e.g., a low voltage detect signal), the CMT rejection circuit 122 outputs the present (e.g., current, live, etc.) output of the demodulator 118 as the output. When output of the example CMT detection circuit 120 is at a voltage representative of a CMT event occurring (e.g., a high voltage detect signal), the CMT rejection circuit 122 outputs a stored demodulated output for a duration of time corresponding to the end of the CMT event (e.g., based on the detect signal) with an additional buffer duration. The stored demodulated output corresponds the output of the demodulator 118 when the voltage detect signal transitions from a voltage representative of no CMT event to a voltage representative of a CMT event occurring. In this manner, when a CMT event is detected, the CMT rejection circuit 122 blocks the present (e.g., ongoing) output of the demodulator 118, which may have one or more glitches, and outputs a previous output of the demodulator 118. The previous output of the demodulator 118 is stored when the CMT event first occurs but before a CMT based glitch can occur.

For example, at time t1 when a CMT event is detected, the CM rejection circuit 122 stores the demodulator output at t1 (e.g., demod_out_t1) and outputs the demod_out_t1 until time t2 (e.g., an amount of time after the CMT detect signals corresponds to no CMT event). Between time t1 and after time t2, the CMT rejection circuit 122 blocks the ongoing (e.g., live) output of the demodulator 118 while continuously outputting the demod_out_t1 (e.g., the demodulator output stored at time t1). Before time t1 and after time t2, the CMT rejection circuit 122 outputs the ongoing (e.g., live) output of the example demodulator 118.

An amount of time (e.g., corresponding to a buffer duration) after the CMT detect signal goes back to a voltage representative of no CMT event (e.g., a CMT end signal, value, and/or voltage), the CMT rejection 122 ceases the blocking of the demodulator output and continues to output the present output of the demodulator 118 until another CMT event is detected. The output of the example CMT detection rejection 122 may be used to control a high-voltage power switch (e.g., control metal oxide semiconductor field effect transistors (MOSFETs), insulated-gate bipolar transistors (IGBTs), gallium nitride transistors, silicon carbide transistors, etc.). A circuit implementation of the example CMT rejection circuit 122 is further described below in conjunction with FIG. 3.

Figure 2:
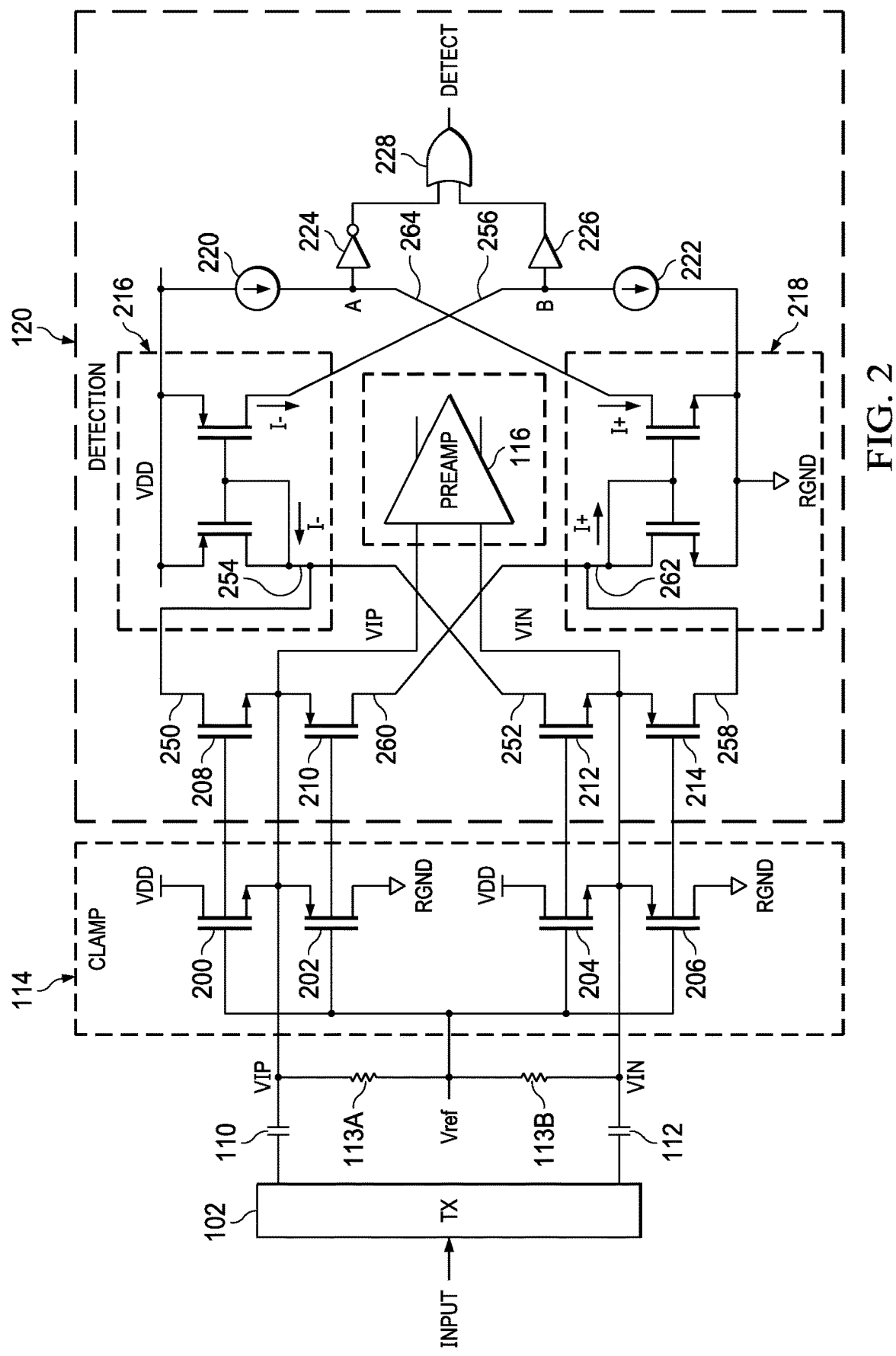
FIG. 2 illustrates an example circuit implementation of the clamp and the common-mode transient detection circuit of FIG. 1.

FIG. 2 is an example circuit implementation of the clamp 114 and the CMT detection circuit 120 of FIG. 1 in conjunction with the example transmitter 102, the example capacitors 110, 112, the example resistors 113a, 113b, and the example preamplifier 116 of FIG. 1. The example clamp 114 includes example switches 200, 202, 204, and 206. The example CMT detection circuit 120 includes example transistors 208, 210, 212, and 214, example current mirrors 216, 218, example current sources 220, 222, an example inverter 224, an example buffer 226, an example OR gate 228, and example terminals 250, 252, 254, 256, 258, 260, 262, and 264.

The example switches 200, 204 of FIG. 2 are devices, such as n-channel metal oxide semiconductor field effect transistors (NMOSFETs or NMOSs). Alternatively, the example switches 200, 204 may be diodes. For example, the example switch 200, 204 may be implemented with diodes (e.g., where the anode of the diode is coupled to the Vref node and the cathode of the diode is coupled to the corresponding input node (Vip/Vin)). The gate terminals of the example switch 200, 204 are coupled to the reference voltage node (Vref) (e.g., coupled to the reference voltage source Vref of FIG. 1 and corresponding to a node voltage of 1 V) and the current terminals (e.g., drain terminals) of the example switches 200, 204 are coupled to a voltage supply (Vdd). The first current terminal (e.g., the source terminal) of the switch 200 is coupled to a first input terminal of the receiver (Vip) and the source terminal of the switch 204 is coupled to a second input terminal of the receiver (Vin). In this manner, the switch 200 clamps negative voltage spikes on the Vip input and the switch 204 clamps negative voltage spikes on the Vin input. For example, when a CMT event occurs at the transmitter 102, a negative voltage spike may be included in the carrier signal and received at the Vip input via the example capacitor 110 and/or at the Vin input via the example capacitor 112. If the example negative voltage spike is detected at either input Vip or Vin that is below the node voltage at the Vref node (e.g., 1 V) minus the threshold voltage (e.g., Vref–Vth or 1V–0.7 V) of the switches 200, 204, the example switches 200, 204 will turn on (e.g., enable) because the voltage at the source terminals of the switches 200, 204 will be lower than the gate voltage by at least the threshold voltage of the switches 200, 204 (e.g., the gate-to-source voltage VGS>0.7 V, because the gate voltage is at the voltage of the Vref node (e.g., 1V) and the source voltage is lower than the threshold voltage). When the example switches 200, 204 are enabled, current will flow from the drain of the switches 200, 204 to the source of the switches 200, 204 and the enabled switches 200, 204 will clamp the voltage at the respective input nodes so that the voltage at the respective input nodes will not go lower than the Vref voltage-Vth (e.g., about 1V–0.7 V=0.3 V).

The example switches 202, 206 of FIG. 2 are devices, such as p-channel transistors (e.g., metal oxide semiconductor field effect transistors (PMOSFETs or PMOSs)). In some examples, the example switch 202, 206 may be implemented with diodes. For example, the switches 202, 206, operating as diodes may include a cathode coupled to the Vref node and an anode coupled to the corresponding input node (Vip/Vin). The gate terminals of the example switch 202, 206 are coupled to the Vref node (e.g., which is coupled to the Vref source of FIG. 1) and the drain terminals of the example switches 202, 206 are coupled to ground (e.g., the receiver ground (RGND)). The source terminal of the switch 202 is coupled to a first input terminal of the receiver (Vip) and the source terminal of the switch 206 is coupled to a second input terminal of the receiver (Vin). In this manner, the switch 202 clamps positive voltage spikes on the Vip input and the switch 206 clamps positive voltage spikes on the Vin input. For example, when a CMT event occurs at the transmitter 102, a positive voltage spike may be included in the carrier signal and received at the Vip input via the example capacitor 110 and/or at the Vin input via the example capacitor 112. If the example positive voltage spike is seen at both inputs and is above the node voltage at Vref plus the of the threshold voltage (e.g., Vref+Vth or 1 V+0.7 V) of the switches 202, 206, the example switches 202, 206 will turn on (e.g., enable) because the voltage at the source terminals of the switches 202, 206 will be greater than the voltage threshold above the voltage at the gate terminal of the switches 202, 206 (e.g., the gate-to-source voltage VGS>0.7 V). When the example switches 202, 206 are enabled, current will flow from the source of the switches 202, 206 to the drain of the switches 202, 206 and the enabled switches 202, 206 will clamp the voltage at the respective input nodes so that the voltage at the respective input nodes will not go above than the node voltage at Vref+Vth (e.g., about 0.7 V).

The example transistors 208, 210, 212, and 214 of FIG. 2 mirror operation of the example switches 200, 202, 204, and 206 to sense current through the corresponding switches 200, 202, 204, and 206. In some examples, because the transistors 208, 210, 212, and 214 only sense current and do not need to operate as a clamp, the transistors 208, 210, 212, and 214 may be smaller (e.g., a smaller width to length ratio of a channel of the transistor) than the switches 200, 202, and 204 of the example clamp 114. Thus, the example transistors 208, 210, 212, and 214 conduct less current, when enabled, (e.g., current from the source to the drain) than the example switches 200, 202, 204, and 206. The example transistors, 208, 212 are n-channel transistors (e.g., metal oxide semiconductor field effect transistors (NMOS-FETs or NMOSs)). The gate terminals of the example transistors 208, 212 are coupled to the Vref node and the drain terminals 250, 252 of the example transistors 208, 212 are coupled together and to an input terminal 250 of the example current mirror 216. The source terminal of the transistor 208 is coupled to a first input terminal of the receiver (Vip) and the source terminal of the transistor 212 is coupled to a second input terminal of the receiver (Vin). The example transistors, 210, 214 are p-channel metal oxide semiconductor field effect transistors (PMOSFETs or PMOSs). The gate terminals of the example transistors 210, 214 are coupled to the Vref node. The drain terminals 258, 260 of the example transistors 210, 214 are coupled together and to the input terminal 262 of the example current mirror 218. The source terminal of the transistor 210 is coupled to a first input terminal of the receiver (Vip) and the source terminal of the transistor 214 is coupled to a second input terminal of the receiver (Vin).

As described above, when a positive voltage spike occurs at the Vip and/or Vin inputs, the example switch 202 and/or the example switch 206 turn(s) on to clamp the voltage at the respective inputs. When the example switches 202, 206 are on, current flows from the source terminal to the drain terminal. The gate terminals and source terminals of respective ones of the example transistors 208, 210, 212, and 214 are coupled to the same nodes as respective ones of the example switches 200, 202, 204, and 206 (e.g., the gate and source terminals of the example transistor 208 are coupled to the same nodes as the gate and source terminal of the example switch 200, the gate and source terminals of the example transistor 210 are coupled to the same notes as the gate and source terminal of the example switch 202, etc.). Thus, the example transistor 208 is enabled when the example switch 200 is enabled, the example transistor 210 is enabled when the example switch 202 is enabled, the example transistor 212 is enabled when the example switch 204 is enabled, and the example transistor 214 is enabled when the example switch 206 is enabled. Accordingly, when current is flowing from the drain terminal to the source terminal of the example switch 200, current is likewise flowing from the drain terminal 250 to the source terminal of the example transistor 208. Thus, when a voltage spike caused by a CMT event occurs at the example Vip node, one or more of the example transistors 208, 210, 212, and 214 draw current proportional to the current drawn by respective ones of the example switches 200, 202, 204, 206.

For example, when a positive voltage spike occurs at the example Vip and Vin nodes, the example switches 202, 206 turn on to clamp the voltage spike and the example transistors 210, 214 turn on to sense currents proportional to the currents from the source terminal to the drain terminal of the example switches 202, 206. Because the drains 258, 260 of the transistors 210, 214 are coupled together at the input terminal 262 of the example current mirror 218 and due to Kirchhoff's current law, the current seen at the input terminal 262 of the current mirror 218 (e.g., I+) is equivalent to the sum of the sensed current from the source to the drain of the transistor 210 and the sensed current from the source to the drain of the transistor 214. Likewise, during a negative voltage spike, the example switches 200, 204 will enable to clamp the negative voltage spike and the example transistors 208, 212 will enable to draw current from the respective drain terminals 250, 252 to the respective source terminals. Because the drains 250, 252 of the example transistors 208, 212 are coupled together at the input terminal 254 of the example current mirror 216 and due to Kirchhoff's current law, the current seen at the input of the current mirror 216 (e.g., I−) is equivalent of the sum of the sensed current from the drain to the source of the transistor 208 and the sensed current from the drain to source of the transistor 212.

The example current mirror 216 of FIG. 2 includes an input terminal 254 that is coupled to the drains 250, 252 of the example transistors 208, 212 and an output terminal 256 that is coupled to the example current source 222 and the example buffer 226. The example current mirror 218 includes an input terminal 262 that is coupled to the drain terminals 258, 260 of the example transistors 210, 214 and an output terminal 264 that is coupled to the current source 220 and the example inverter 224. The example current mirrors 216, 218 of FIG. 2 mirrors (e.g., copies) the current seen at the input terminal 254, 262 of the respective current mirror to ensure that the current at the output terminal 256, 264 of the respective current mirror is the same as the current at the input. For example, the current mirror 216 ensures that the current at the input terminal 254 of the example current mirror 216 (e.g., I−) that flows from the input terminal 254 of the current mirror 216 to the drains 258, 260 of the example transistor(s) 208, 212 is output at the output terminal 264 (e.g., from (A) the output terminal 264 to (B) (i) the input terminal of the example buffer 226 and (ii) the input terminal of the current source 222). In some examples, the current at the output terminal 256 of the current mirror 216 is equivalent to a scaled amount of the current at the input terminal 250 of the current mirror 216. In a similar manner, the current mirror 218 ensures that the current at the input terminal 262 of the example current mirror 218 (e.g., I+) that flows from the drain terminal(s) 258, 260 of the example transistors 214, 208 is the same as, or a scaled amount of, the current at the output terminal 264 of the example current mirror 218 (e.g., from the current source 220 and the example inverter 224).

The example current source 220 of FIG. 2 is coupled to the Vdd, the output terminal 264 of the example current mirror 218 and the input of the example inverter 224. The example current source 222 is coupled to RGND, the output terminal 264 of the example current mirror 216, and the input of the example buffer 226. The example current sources 220, 222 provide relatively constant reference currents to compare against the output current of the current mirrors 216, 218. The example current source 220 causes a first predefined current to flow from Vdd toward node A and the example current source 222 causes a second predefined current to flow from node B toward ground. The first and second predefined currents correspond to an amount of current that will flow through the respective ones example transistors 208, 210, 212, 214 when a CMT event is occurring. The example current sources 220, 222 could be implemented by a resistive element (e.g., a resistor, a variable resistor, a potentiometer, a transistor configured to provide a resistive element, etc.) In some examples, the amount of current can be preset and/or adjusted to be more or less sensitive to voltage variation at the input nodes Vin, Vip by selecting a resistive element corresponding to a desired amount of sensitivity or adjusting a variable resistor (e.g., a potentiometer), thereby being more or less sensitive to the CMTI slew rate.

The example inverter 224 of FIG. 2 is an inverter or an inverted buffer that is coupled to the example current source 220 and the output terminal 264 of the example current mirror 218 at node A. The example inverter 224 is configured to output a voltage opposite of the voltage at the input node. For example, when the voltage at the input node (A) of the inverter 224 is high, the voltage at the output terminal (A') of the inverter 224 will be low. The voltage at the input node corresponds to whether (i) the current from the current source 220 is higher or lower than (ii) the current from node A to the output terminal 264 of the example current mirror 218 (I+). When there is no current spike at Vip and Vin, the example switches 202, 206, 210, and 214 will be disabled and no current will flow through the switches 202, 206, 210, and 214. Thus, no current will be mirrored by the example current mirror 218. If there is no current from node A to the output terminal 264 of the example current mirror 218 (e.g., I+=0), then node A will be pulled high (e.g., pulled high to the rail voltage Vdd) due to the current source 220 and the comparator will output a low voltage corresponding to no positive voltage spike. However, if there is a positive voltage spike at nodes Vip and Vin, the example switches 202, 206, 210, and 214 will be enabled and current will flow through the switches 202, 206, 210, and 214. Thus, the example current mirror 218 will mirror (A) the current from the drains 258, 260 of the transistors 210, 214 to the input terminal 262 of the example current mirror 218 at (B) the output terminal 264 of the example current mirror 218. If the mirrored current (e.g., I+) is more than the current from the example current source 220 node A will be pulled low (e.g., puled low to the receiver ground (RGND)) by the mirrored current (e.g., I+), thereby causing the inverter 224 to output a high voltage representative of the positive voltage spike. Although FIG. 2 includes the example inverter 224, in some examples, the inverter 224 may be replaced with an analog current comparator with two inputs (e.g., one for the current from the current source 220 and one for the current from the output terminal 264 of the current mirror 218). In such examples, the analog current comparator outputs a voltage corresponding to which current (e.g., the current from the current source 220 or the current from the output terminal 264 of the current mirror 218) is larger.

The example buffer 226 of FIG. 2 is a buffer that is coupled to the example current source 222 and the output of the example current mirror 216 at node B. The example buffer 226 output a voltage substantially equal to the voltage at the input node. For example, when the voltage at the input node (B) of the inverter 224 is high, the voltage at the output terminal (B') of the inverter 224 will be high. The voltage at the input node corresponds to whether (i) the current from node B to the current source 222 is higher or lower than (ii) the current from the output of the example current mirror 216 (I−). When there is no negative current spike at Vip and Vin, the example switches 200, 204, 208, and 212 will be disabled and no current will flow through the switches 200, 204, 208, and 212. Thus, no current will be mirrored by the example current mirror 216. If there is no current from node B to the output terminal 256 of the example current mirror 216 (e.g., I−=0), then the current from the current source 222 will pull node B low and the buffer 226 will output a low voltage corresponding to no positive voltage spike. However, if there is a negative voltage spike at nodes Vip and Vin, the example switches 200, 204, 208, and 212 will be enabled and current will flow through the switches 200, 204, 208, and 212. Thus, the example current mirror 216 will mirror the current to the drain terminals 250, 252 of the transistors 208, 212 from the input terminal 250 of the example current mirror 216 at the output terminal 256 of the example current mirror 216. If the mirrored current (e.g., I−) is more than the current from the example current source 222, node B will be pulled high by the mirrored current (e.g., I−)), thereby causing the buffer 226 to output a high voltage representative of the positive voltage spike. Although the example of FIG. 2 includes the example buffer, 226, in some examples, the buffer 226 may be replaced with an analog current comparator with two inputs (e.g., one for the current from the current source 222 and one for the current from the output terminal 256 of the current mirror 216). In such examples, the analog current comparator outputs a voltage corresponding to which current (e.g., the current from the current source 222 or the current from the output terminal 254 of the current mirror 216) is larger.

The example OR gate 228 of FIG. 2 includes a first input coupled to the output of the inverter 224 and a second input coupled to the output of the example buffer 226. The example OR gate 228 is a logic OR gate. In this manner, if the voltage at the output of the example inverter 224 is high (e.g., representative of a negative voltage spike at one or more of the input nodes Vip, Vin) and/or the output of the example buffer 226 is high (e.g., representative of a positive voltage spike at one or more of the input nodes Vip, Vin), the example OR gate 228 will output, at the detect node, a detect signal as a high voltage representative of a CMT event. If the voltage at the output of the example buffer 226 is low (e.g., representative of no negative voltage spike at one or more of the input nodes Vip, Vin) and the output of the example inverter 224 is low (e.g., representative of no positive voltage spike at one or more of the input nodes Vip, Vin), the example OR gate 228 will output, at the detect node, the detect signal as a low voltage representative of no CMT event (e.g., a CMT end signal, value, and/or voltage). The output of the example OR gate 228 is coupled to CMT rejection circuit 122, as further described below in conjunction with FIG. 3.

Figure 3:
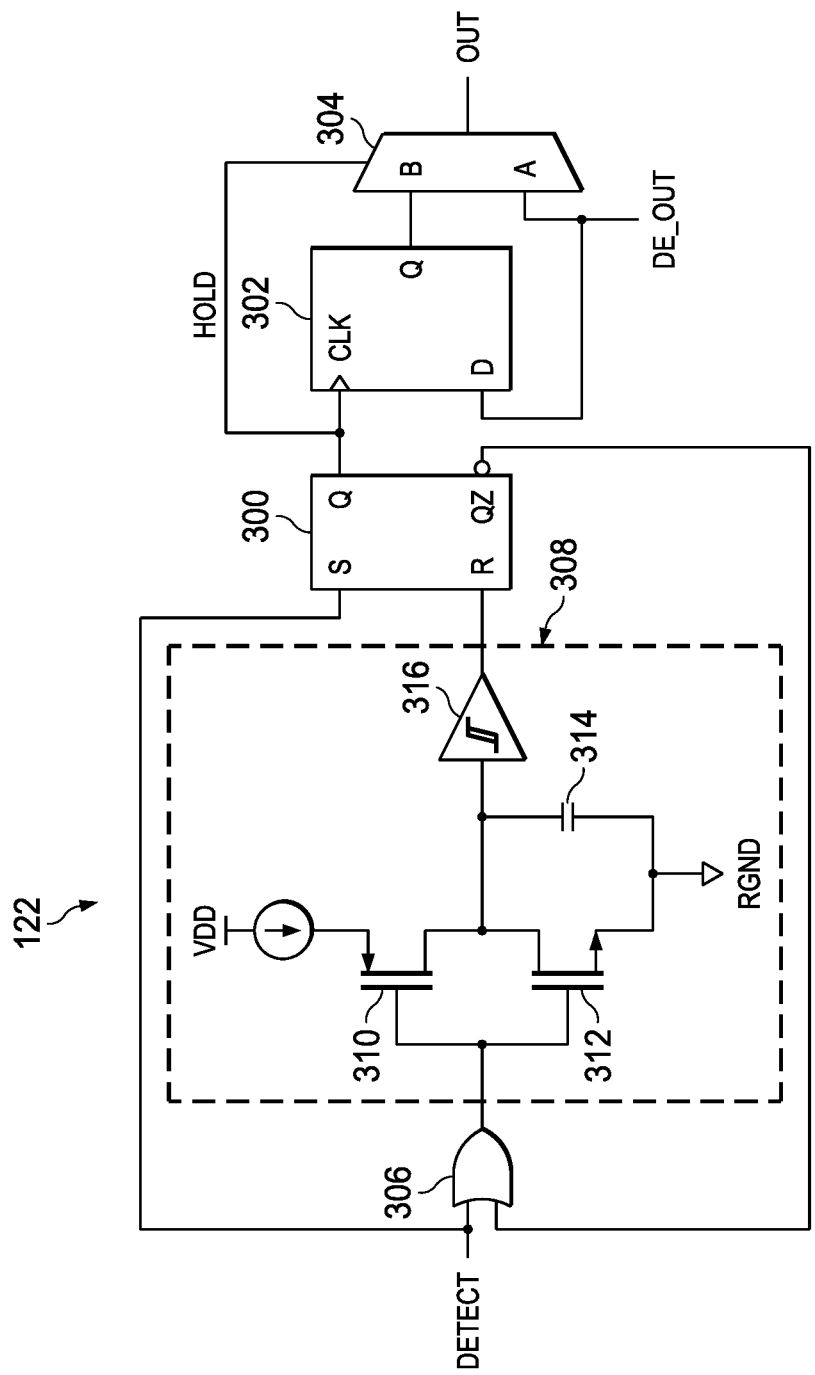
FIG. 3 illustrates an example circuit implementation of the common-mode rejection circuit of FIG. 1.

FIG. 3 is an example circuit implementation of the CMT rejection circuit 122 of FIG. 1. The example CMT rejection circuit 122 of FIG. 3 includes example flip flops 300, 302, an example multiplexer 304, an example logic gate 306, and an example stretch circuit 308. The example stretch circuit 308 includes example transistors 310, 312, an example capacitor 314, and an example buffer 316.

The example flip flop 300 of FIG. 3 is a state triggered set-reset flip flop and/or latch. Alternatively, the example flip flop 300 may be another type of flip flop or latch. The example flip flop 300 includes a set input coupled to the output of the example CMT detection circuit 120 of FIG. 1 (e.g., the output of the OR gate 228 of FIG. 2), a reset input coupled to the output of the stretch circuit 308 (e.g., the output of the example buffer 316), an output coupled to a clock input of the example flip flop 302 and a select input of the example multiplexer 304, and an inverted output coupled to a second input of the example logic gate 306. When the example flip flop 300 receives a high voltage (e.g., representative of a CMT event) from the output of the example CMT detection circuit 120 at the set terminal, the flip flop 300 sets by outputting a high voltage at the output (Q) of the flip flop 300 to trigger a demodulator output hold/block signal (e.g., for a duration of time so that any glitches corresponding to the CMT event are rejected). When the voltage at the reset terminal of the flip flop 300 goes from a low voltage to a high voltage, the flip flop 300 resets by outputting a low voltage at the output (Q) of the flip flop 300. The inverted output (QZ) terminal of the flip flop 300 outputs a voltage opposite of the voltage output at the output (Q) terminal. For example, when the flip flop 300 outputs a high voltage at the output (Q) terminal, the flip flop 300 outputs a low voltage at the inverter output (QZ) terminal and, when the flip flop 300 outputs a low voltage at the output (Q) terminal, the flip flop 300 outputs a high voltage at the inverter output (QZ) terminal. When the output of the inverter output (QZ) terminal goes to a low voltage, the low voltage triggers the example stretch circuit 308 to trigger the reset of the flip flop 300 after a threshold amount of time, as further described below.

The example flip flop 302 of FIG. 3 is a single positive edge triggered D-type flip flop and/or latch. Alternatively, the example flip flop 300 may be another type of flip flop or latch. The example flip flop 302 includes a input clock terminal coupled to the output (Q) terminal of the example flip flop 300, a data (D) input terminal (e.g., a data terminal) coupled to the output of the example demodulator 118 of FIG. 1, and an output (Q) terminal coupled to a first input (B) terminal of the example multiplexer 304. When the output (Q) of the example flip flop 300 increases from a low voltage to a high voltage (e.g., when a CMT event is detected), the example flip flop 302 stores the value (e.g., voltage) at the D input terminal (e.g., the output of the demodulator 118) and outputs the stored value at the Q output terminal until another rising edge (e.g., from a low voltage to a high voltage) is received at the example input clock terminal of the flip flop 302.

The example multiplexer 304 of FIG. 3 includes a first input (A) terminal coupled to the output of the example demodulator 118, a second input (B) terminal coupled to the output (Q) of the example flip flop 302, and a select input coupled to the output (Q) of the example flip flop 300, and an output terminal corresponding to the input data that was transmitted from the example transmitter 102 of FIG. 1. The example multiplexer 304 outputs (at the output terminal) the voltage at the B input terminal when the voltage at the select terminal is a high voltage and outputs the voltage at the A input terminal when the voltage at the select terminal is a low voltage. Because the voltage at the select terminal corresponds to a hold/block voltage when a CMT event is occurring, the example multiplexer 304 outputs the output of the demodulator 118 when no CMT event is occurring and outputs the stored voltage of the flip flop 302 (e.g., the voltage output by the demodulator at the time when the CMT event was detected) when a CMT event is occurring.

The example logic gate 306 FIG. 3 includes a first input coupled to the output of the CMT detection circuit 120, a second input coupled to the output of the inverted output of the example flip flop 300, and an output coupled to the input of the example stretching circuit 308. The example logic gate 306 is a logic OR gate. In this manner, if the voltage at the output of the example CMT detection circuit 120 is high (e.g., representative of a CMT event occurring) and/or the output of the inverted output terminal of the example flip flop 300 is high, the example logic gate 306 will output a high voltage to the example stretching circuit 308. If the voltage at the output of the example CMT detection circuit 120 is low (e.g., representative of no CMT event occurring) and the output of the inverted output terminal of the example flip flop 300 is low, the example logic gate 306 will output a low voltage to the example stretching circuit 308.

The example stretching circuit 308 of FIG. 3 includes an input coupled to the output of the example logic gate 306 and an output coupled to the reset terminal of the example flip flop 300. The example stretching circuit 308 is a buffer that delays the reset of the example flip flop in response to the detect signal going from a high voltage (e.g., representative of a CMT event) to a low voltage representative of no CMT event. The example stretching circuit 308 delays outputting a voltage sufficient to cause a reset because a CMT event may causing ringing that may result in subsequent voltage spikes after the initial voltage spike. The duration of the delay corresponds to the capacitance of the example capacitor 314, as further described below.

During startup and/or while no CMT event has been detected, the example logic gate 306 of FIG. 3 outputs a high voltage (e.g., the inverted output (QZ) is a high voltage because the voltage at the set terminal is a low voltage and has not set the flip flop 300). When the output of the logic gate 306 is high, the example transistor 310 is disabled and the example transistor 312 is enabled (e.g., because the high voltage is applied to the gates of the example transistors 310, 312), thereby grounding the input of the example buffer 316 and causing the example capacitor 314 to discharge any stored charge to ground. Because the voltage at the input of the buffer 316 is low, the output of the buffer 316 is likewise low. When the detect signal goes to a high voltage (e.g., based on detecting a CMT event), the output of the logic gate 306 remains high. Thus, the output of the example logic gate 306 remains high and the stretching circuit 308 continues to output a low voltage to the reset terminal of the example flip flop 300. After the detect signal goes back to a low voltage from the high voltage, the flip flop 300 will continue to output a high voltage at the output (Q) terminal and output a low voltage at the inverted output (QZ) terminal until the flip flop 300 is reset (e.g., in response to the voltage at the reset terminal increases from a low voltage to a high voltage). Accordingly, the two inputs of the example logic gate 306 will be low voltages, thereby causing the example logic gate 306 to output a low voltage to the input of the example stretching circuit 308.

When the logic gate 306 of FIG. 3 outputs a low voltage to the input of the example stretching circuit 308, the example transistor 310 is enabled and the example transistor 312 is disabled (e.g., because the low voltage is applied to the gates of the example transistors 310, 312), thereby causing the voltage source Vdd to be coupled to the capacitor 314 causing the example capacitor 314 to charge based on the voltage differential across the capacitor 314. Because the capacitor 314 does not charge instantaneously, the voltage across the capacitor 314 gradually increases from 0V to Vdd based on the capacitance of the capacitor 314 (e.g., unless discharged within during the gradual increase). Accordingly, the voltage at the input of the buffer 316 gradually increases from 0V to Vdd based on the capacitance of the capacitor 314. The buffer 316 will output a high voltage in response to the voltage across the capacitor 314 (e.g., the voltage at the input of the buffer 316) increasing to and/or above a voltage above the threshold voltage of the buffer 316. Accordingly, the duration of the delay that the stretch circuit 308 generates corresponds to the amount of capacitance of the example capacitor 314 because the amount of capacitance correlates to how fast the capacitor 314 will charge (e.g., correlating to how fast the buffer 316 will trigger the high voltage output). In response to the flip flop 300 resetting, the flip flop 300 will output a high voltage at the inverted output (QZ) terminal, thereby causing the logic gate 306 to output a high voltage to ground the example capacitor 314, thereby discharging the charge at the example capacitor 314.

While an example manner of implementing the example receiver 104 of FIG. 1 is illustrated in FIGS. 1-3, one or more of the elements, processes and/or devices illustrated in FIGS. 1-3 may be combined, divided, re-arranged, omitted, eliminated and/or implemented in any other way. Further, the example capacitors 110, 112, 314 the example resistors 113a, 113b, the example clamp 114, the example preamplifier 116, the example demodulator 118, the example CMT detection circuit 120, the example CMT rejection circuit 112, the example switches 200, 202, 204, 206, 208, 210, 212, 214, 310, and 312 the example current mirrors 216, 218, the example current sources 220, 222, the example inverter 224, the example buffers 226, 316, the example logic gates 228, 306, the example flip flops 300, 302, the example multiplexer 304, the example stretch circuit 308, and/or, more generally, the example receiver 104 of FIGS. 1-3 may be implemented by hardware, software, firmware and/or any combination of hardware, software and/or firmware. Thus, for example, any of the example capacitors 110, 112, and 314 the example resistors 113a, 113b, the example clamp 114, the example preamplifier 116, the example demodulator 118, the example CMT detection circuit 120, the example CMT rejection circuit 112, the example switches 200, 202, 204, 206, 208, 210, 212, 214, 310, and 312 the example current mirrors 216, 218, the example current sources 220, 222, the example inverter 224, the example buffers 226, 316, the example logic gates 228, 306, the example flip flops 300, 302, the example multiplexer 304, the example stretch circuit 308, and/or, more generally, the example receiver 104 of FIGS. 1-3 could be implemented by one or more analog or digital circuit(s), logic circuits, programmable processor(s), programmable controller(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example capacitors 110, 112, and 314 the example resistors 113a, 113b, the example clamp 114, the example preamplifier 116, the example demodulator 118, the example CMT detection circuit 120, the example CMT rejection circuit 112, the example switches 200, 202, 204, 206, 208, 210, 212, 214, 310, and 312 the example current mirrors 216, 218, the example current sources 220, 222, the example inverter 224, the example buffers 226, 316, the example logic gates 228, 306, the example flip flops 300, 302, the example multiplexer 304, the example stretch circuit 308, and/or, more generally, the example receiver 104 of FIGS. 1-3 is/are hereby expressly defined to include a non-transitory computer readable storage device or storage disk such as a memory, a digital versatile disk (DVD), a compact disk (CD), a Blu-ray disk, etc. including the software and/or firmware. Further still, the example receiver 104 of FIG. 1 may include one or more elements, processes and/or devices in addition to, or instead of, those illustrated in FIGS. 1-3, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 4:
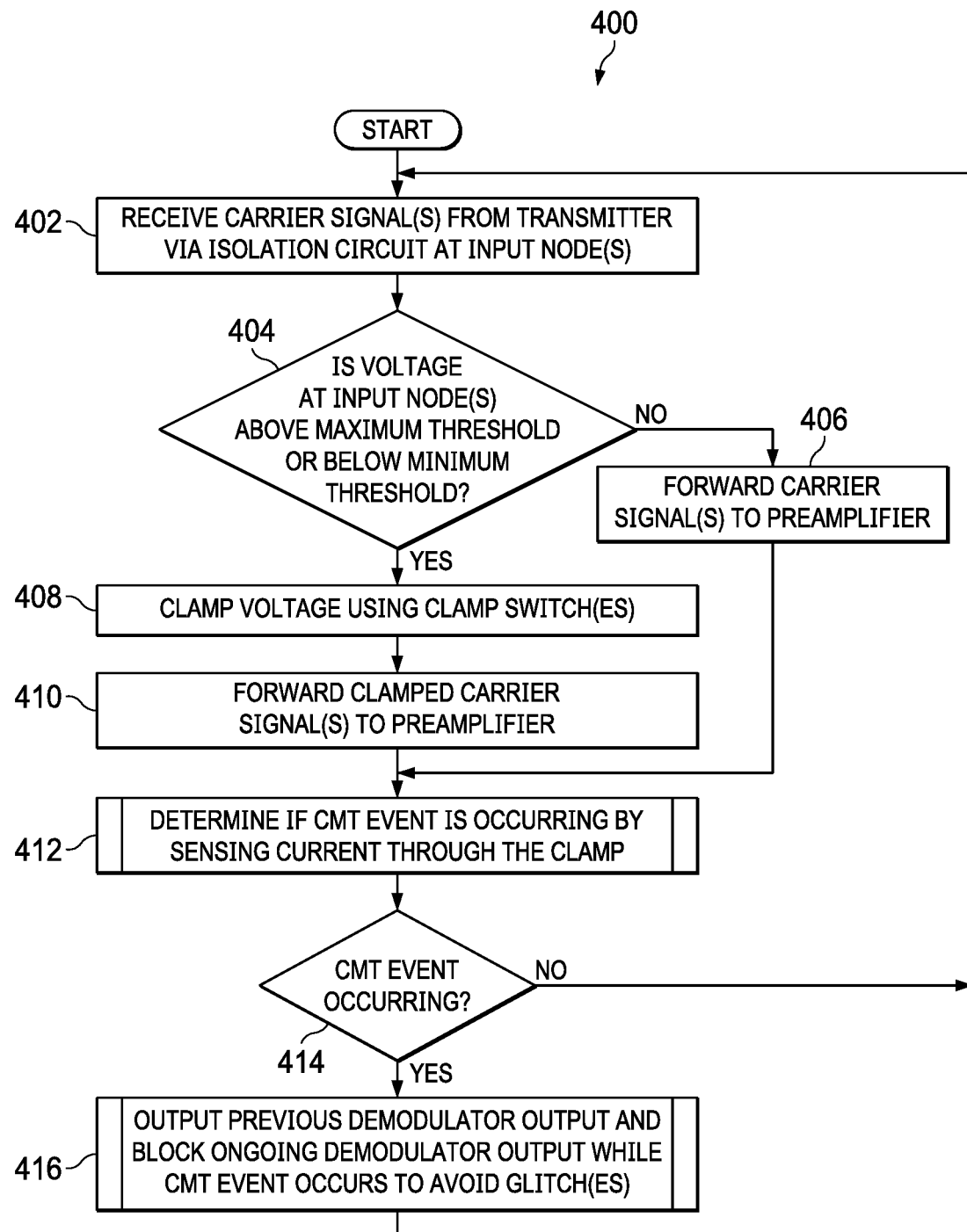
FIGS. 4-6 are flowcharts representative of example machine readable instructions that may be executed and/or example hardware configurations to implement the receiver of FIG. 1.
Figure 5:
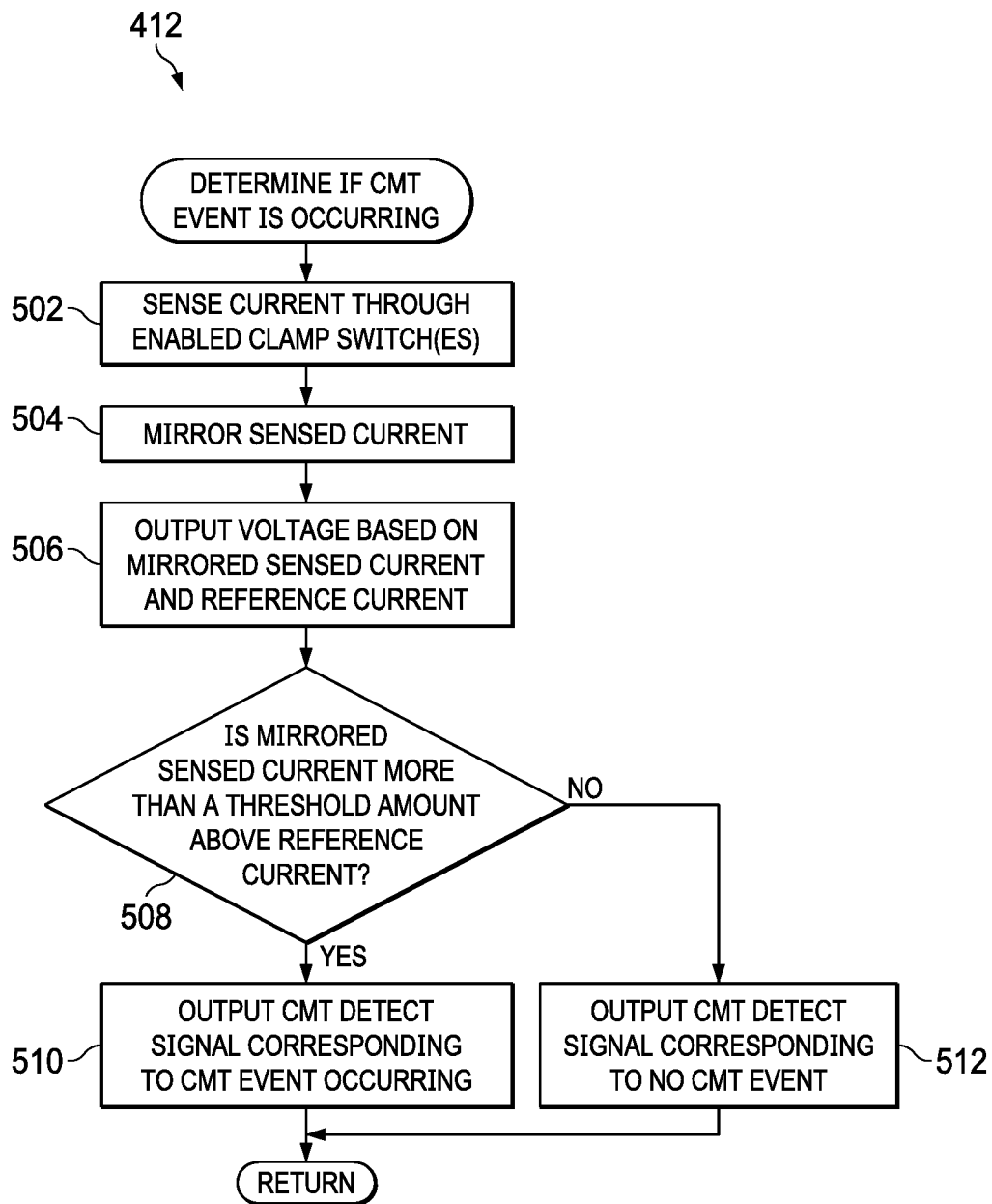
Figure 6:
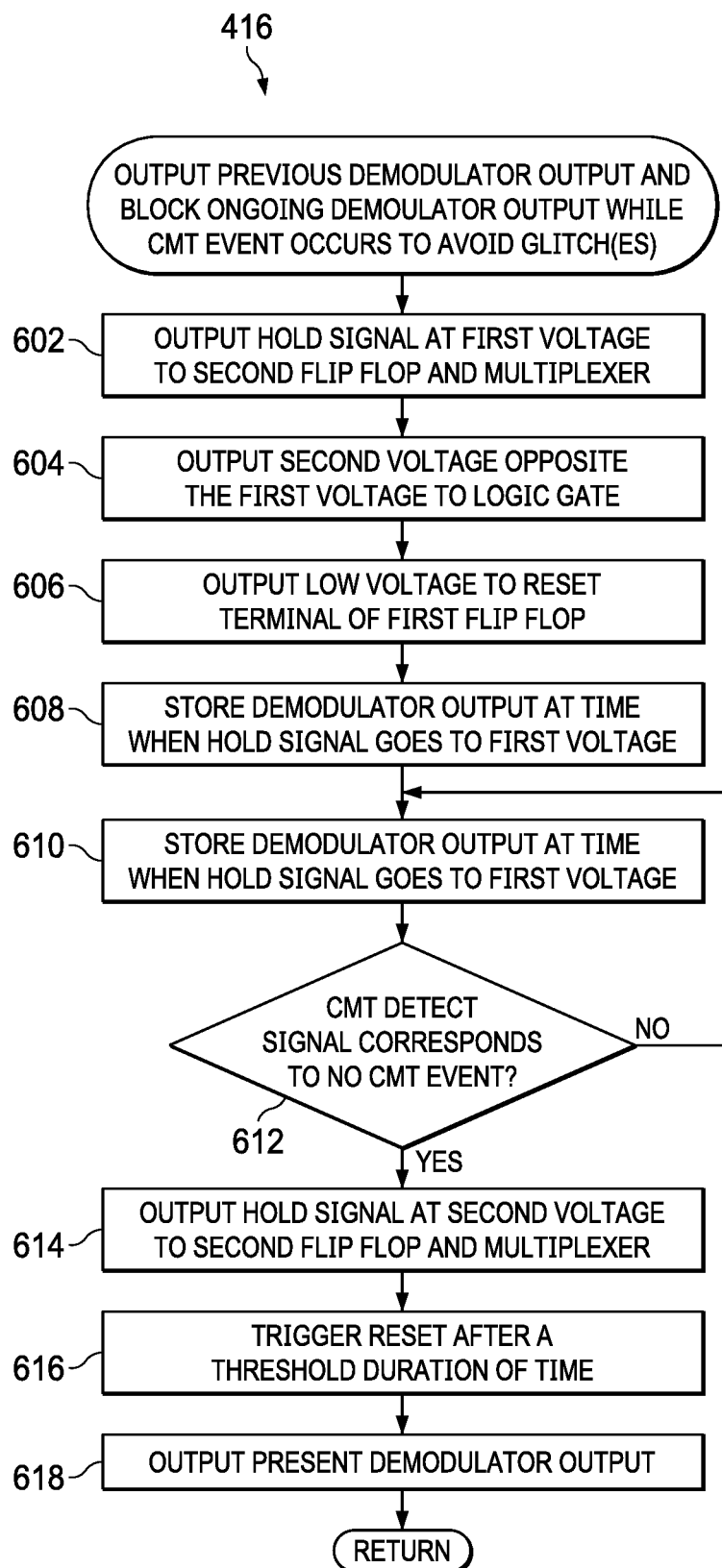

Flowcharts representative of example hardware logic, machine readable instructions, hardware implemented state machines, and/or any combination thereof for implementing the receiver 104 of FIGS. 1-3 are shown in FIGS. 4-6. The machine readable instructions may be an executable program or portion of an executable program or portion(s) of an executable program for execution by a computer processor such as the receiver 104 discussed above in connection with FIGS. 1-3. The program may be embodied in software stored on a non-transitory computer readable storage medium such as a CD-ROM, a floppy disk, a hard drive, a DVD, a Blu-ray disk, or a memory associated with the receiver 104 but the entire program and/or parts thereof could alternatively be executed by a device other than the receiver 104 and/or embodied in firmware or dedicated hardware. Further, although the example program is described with reference to the flowchart illustrated in FIGS. 4-6, many other methods of implementing the example receiver 104 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, etc. in order to make them directly readable and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein. In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

As mentioned above, the example processes of FIGS. 4-6 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

FIG. 4 is an example flowchart 400 representative of example machine readable instructions that may be executed by the example receiver 104 and/or hardware implementations of the example receiver 104 of FIG. 1 to perform a CMTI protocol for received data. Although the flowchart 400 of FIG. 4 is described in conjunction with the example receiver 104 of FIG. 1, other type(s) of receiver(s) and/or other type(s) of processor(s) may be utilized instead.

At block 402, the example clamp 114 receives carrier signal(s) from the example transmitter 102 via the isolation circuit (e.g., the example capacitors 110, 112) at the input node(s) (e.g., Vip, Vin). The carrier signal(s) may be out of phase carrier signals that, when demodulated, identify data. At block 404, the example clamp determines if the voltage at the input node(s) is above a maximum threshold or a minimum threshold. For example, the example switches 200, 204 determine if the voltage is below a minimum voltage based on the gate-to-source voltage of the switches 200, 204 (e.g., because the gate terminal of the switches 200, 204 are tied to the Vref node (e.g., coupled to the reference voltage source Vref of FIG. 1) and the source terminal of the transistors are tied to the input(s), when the voltage at the input goes below a voltage threshold of the switches 200, 204, the transistors enable). Likewise, the example switch 202, 206 determine if the voltage is above a maximum voltage based on the gate-to-source voltage of the switches 202, 206.

If the example clamp 114 determines that the voltage at the input node(s) is/are not above the maximum threshold or below the minim threshold (block 404: NO), the example clamp 114 does not clamp the carrier signal(s) and the unclamped carrier signals are forwarded to the example preamplifier 116 (block 406). As described above in conjunction with FIG. 1, the preamplifier 116 amplifies the carrier signals so that the example demodulator 118 can demodulate the carrier signal(s) to identify the data. If the example clamp 114 determines that the voltage at the input node(s) is/are above the maximum threshold or below the minim threshold (block 404: YES), the example clamp 114 clamps the voltage using clamp device(s) (e.g., one or more of the example switches 200, 202, 204, 206) (block 408). At block 410, the example clamp 114 forwards the clamped carrier signal(s) to the example preamplifier 116.

At block 412, the example CMT detection circuit 112 determines if a CMT event is occurring by sensing the current through the devices (e.g., the switches 200, 202, 204, 206) of the clamp, as further described below in conjunction with FIG. 5. If the voltage at the input nodes are not clamped, the CMT detection circuit 112 will not sense any current, because there will be no current through the clamp switches. If a CMT event is not occurring (block 414: NO), control returns to block 402 to continue to receive the carrier signal(s). If a CMT event is occurring (block 414: YES), the example CMT rejection circuit 122 outputs a previous demodulator output (e.g., stored at the time when the CMT detection circuit 120 detects the CMT event) and blocks the on-going demodulator output while the CMT event occurs (and for a duration of time after the CMT event ends) to avoid glitch(es) in the demodulator output caused by the CMT event (block 416), as further described below in conjunction with FIG. 6.

FIG. 5 is an example flowchart 412 representative of example machine readable instructions that may be executed by the example CMT detection circuit 120 and/or hardware implementations of the example CMT detection circuit 120 of FIGS. 1 and/or 2 to determine if a CMT event is occurring, as described above in conjunction with block 412 of FIG. 4. Although the flowchart 412 of FIG. 5 is described in conjunction with the example CMT detection circuit 120 of FIGS. 1 and/or 2, other type(s) of CMT detection circuit(s) and/or other type(s) of processor(s) may be utilized instead.

At block 502, one or more of the example transistors 208, 210, 212, and 214 sense the current through the enabled clamp switch(es) (e.g., one or more of the example switches 200, 202, 204, and 206). For example, as described above in conjunction with FIG. 2, the example transistors 208, 212 are enabled when the example clamp switches 200, 204 are enabled. Accordingly, a current proportional to the drain-to-source of the switches 202, 204 flows from the drain to the source of the transistors 208, 212. Likewise, the example transistors 210 214 sense a current proportional to the drain-to source of the switches 200, 202, when the switches 200, 202, 210, and 214 are enabled. At block 504, the example current mirrors 216, 218 mirror the sensed current (e.g., at the output terminals 256, 264 of the current mirrors 216, 218). If there is no sensed current (e.g., because one or more of the example transistors 208, 210, 212, and 214 are disabled), the current mirrors 216, 218 will mirror zero current at the output terminals 256, 264 of the respective current mirrors 216, 218.

At block 506, the example inverter 224 and/or the example buffer 226 output a voltage based on the mirrored sensed current and a reference current. For example, the buffer 226 outputs a voltage based on the mirrored sensed current from the output terminal 256 of the example current mirror 216 to the node B and the current from node B to the current source 222 based on Kirchhoff's current law. In such an example, if the current from the current the current mirror 216 to node B is more than the current from node B to the current source 222, current will flow from node B to the input of the buffer 226 pulling the voltage at node B high. If the current from the current the current mirror 216 to node B is less than the current from node B to the current source 222, current will flow the input of the buffer 226 to node B pulling the voltage at node B low. Thus, the buffer 226 outputs a voltage based on the mirrored sensed current whether current is going from node B to the input of the buffer 226 or from the buffer 226 to node B. The example inverter 224 likewise outputs a voltage based on the mirrored sense current from node A to the output terminal 264 of the current mirror 218 and the current from the current source 220 to node A based on whether current is going from node A to the input of the inverter 224 or from the inverter 224 to node A.

At block 508, one or more of the example inverter 224 or the buffer 226 determine(s) if the mirrored sensed current at the output terminals 256, 264 of the respective example current mirrors 216, 218 is more than a threshold amount (e.g., corresponding to the current and/or voltage threshold of the example inverter 224 and/or buffer 226) above the reference current (e.g., corresponding to the current drawn by the respective example current sources 220, 222). For example, the example inverter 224 determines if the mirrored sense current at the output terminal 264 of the example current mirror 218 is more than a threshold amount above the reference current from the example current source 220 by measuring the current at the input of the example inverter 224 (e.g., to/from node A). If the current flows from node A to the input of the inverter 224, the inverter 224 will output a low voltage corresponding to no CMT event and if the current flows from the input of the inverter 224 to the node A, the inverter 224 will output a high voltage corresponding to a CMT event. Likewise, the example buffer 226 determines if the mirrored sense current at the output terminal 256 of the example current mirror 216 is more than a threshold amount above the reference current from the example current source 222 by measuring the current at the input of the example buffer 226 (e.g., to/from node B). If the current flows from node B to the input of the buffer 226, the buffer 226 will output a high voltage corresponding to a CMT event and if the current flows from the input of the buffer 226 to the node B, the inverter 224 will output a low voltage corresponding to no CMT event.

If the one or more of the example inverter 224 or the example buffer 226 determines that the mirrored sense current(s) is/are more than a threshold amount above the reference current (block 508: YES), the example OR gate 228 outputs a CMT detect signal corresponding to a CMT event occurring (e.g., a high voltage at the detect node) (block 510) and control returns to FIG. 4. If the one or more of the example inverter 224 or the buffer 226 determines that the mirrored sense current(s) is/are not more than a threshold amount above the reference current (block 508: NO), the example OR gate 228 outputs a CMT detect signal corresponding to no CMT event occurring (e.g., a low voltage at the detect node) (block 512) and control returns to FIG. 4.

FIG. 6 is an example flowchart 416 representative of example machine readable instructions that may be executed by the example CMT rejection circuit 122 and/or hardware implementations of the example CMT rejection circuit 122 of FIGS. 1 and/or 2 to outputs a previous demodulator output (e.g., stored at the time when the CMT detection circuit 120 detects the CMT event) and blocks the on-going demodulator output while a CMT event occurs to avoid glitch(es), as described above in conjunction with block 416 of FIG. 4. Although the flowchart 416 of FIG. 6 is described in conjunction with the example CMT rejection circuit 122 of FIGS. 1 and/or 2, other type(s) of CMT rejection circuit(s) and/or other type(s) of processor(s) may be utilized instead.

At block 602, the example flip flop 300 outputs a hold/block signal at a first voltage (e.g., a high voltage) at the output (Q) terminal to the clock input terminal of the example flip flop 302 and to the select input of the example multiplexer 304. For example, the flip flop 300 sets (e.g., adjusts the voltage output at the Q output terminal from a low voltage to a high voltage) in response to receiving a high voltage at the set terminal. At block 604, the example flip flop 300 outputs a second voltage (e.g., a low voltage) opposite the first voltage to the example logic gate 306. Because the example logic gate 306 has at least one input that receives a high voltage, the logic gate 306 outputs a high voltage to the example stretch circuit 308, thereby enabling the example transistor 312 to ground the example buffer 316 and/or discharge any charge stored in the example capacitor 314.

At block 606, the example buffer 316 of the example stretch circuit 308 outputs a low voltage to the reset terminal of the example flip flop 300 (e.g., because the input of the example buffer 316 is grounded). At block 608, the example flip flop 302 stores the output of the example demodulator 118 of FIG. 1 (e.g., in response to the hold/block signal going from a low voltage to a high voltage). As described above, the flip flop 302 is structured to output the stored output/held output until a subsequent rising edge of the hold/block signal is detected at the clock input terminal. At block 610, the example flip flop 302 outputs the stored output of the demodulator (e.g., the held output or held demodulator output) output at the output (Q) of the flip flop 302. Because the voltage at the select terminal of the example multiplexer 304 is a high voltage and the output of the flip flop 302 is coupled to the input (B) of the example multiplexer 304, the example multiplexer 304 outputs the stored/held demodulator output (e.g., thereby outputting the previous demodulator output and blocking the ongoing demodulator output) until the voltage at the select input changes to a low voltage (e.g., corresponding to no CMT event).

At block 612, the example flip flop 300 determines if the CMT signal correspond to no CMT event. For example, if the signal from the example CMT detection circuit 120 is at a low voltage, the example flip flop 300 determines that the CMT signal corresponds to a no CMT event. If the signal from the example CMT detection circuit 120 is a high voltage, the example flip flop 300 determines that the CMT signal corresponds to a CMT event. If the example flip flop 300 determines that the CMT decoction signal does not correspond to a no CMT event (block 612: NO), control returns to block 610 and the flip flop 302 and the example multiplexer 304 continues to output the stored/held demodulator output.

If the example flip flop 300 determines that the CMT detection signal does correspond to a no CMT event (block 612: YES), the example flip flop 300 outputs the hold/block signal at the second voltage (e.g., the low voltage to the second flip flop 302 and the select terminal of the multiplexer 304) (block 614). Additionally, the flip flop 300 outputs the first voltage (e.g., a high voltage) at the inverted output (QZ) terminal of the example flip flop 300.

At block 616 the example stretch circuit 308 triggers a high voltage at the reset terminal of the flip flop 300 after a threshold duration of time. For example, when the flip flop 300 determines that the CMT detection signal corresponds to no CMT, both inputs of the logic gate 306 will be at a low voltage. Accordingly, the example logic gate 306 will output a low voltage to enable the example transistor 310 of the example stretch circuit 308, thereby causing the example capacitor 314 to charge based on the voltage differential from Vdd to ground. As the capacitor 314 charges, the voltage at the input of the example buffer 316 increases from 0V to Vdd. In response to the voltage at the input exceeding the threshold voltage of the buffer 316, the example buffer 316 outputs a high voltage to the reset terminal of the example flip flop 300 to cause the flip flop 300 to reset (e.g., causing the output (Q) terminal to output a low voltage and the inverted output terminal (QZ) to output a high voltage). At block 618, in response to the output hold/block signal transitioning from the first (e.g., high) voltage to the second (e.g., low) voltage at the select input of the multiplexer 304, the example multiplexer 304 outputs the present (e.g., current, live, ongoing, etc.) demodulator output (e.g., the present output or present demodulator output) as the output.

Figure 7:
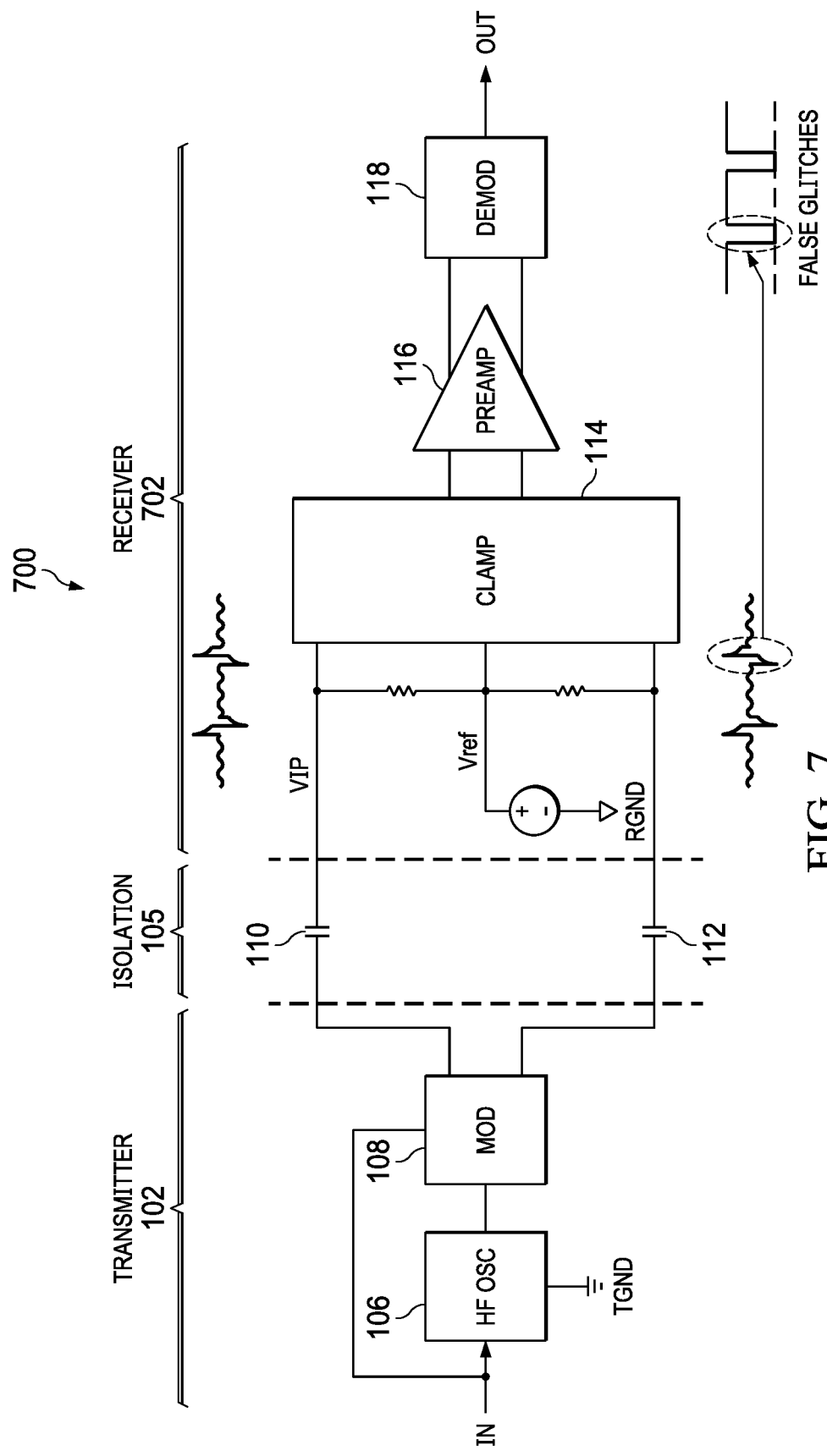
FIG. 7 illustrates an example transmitter coupled to an example receiver via an isolation channel without the common-mode transient detection circuit or the common-mode rejection circuit of FIGS. 1, 2 and/or 3.

FIG. 7 illustrates an example isolation circuit 700 including the example transmitter 102 of FIG. 1 transmitting data to an example receiver 702 via an isolation channel. The example transmitter 102 includes the example high frequency oscillator 106, the example modulator 108, and, in some examples, one or more of the example capacitors 110, 112 of FIG. 1. The example receiver 702 of FIG. 7 includes the example clamp 114, the example preamplifier 116, the example demodulator 118, in some examples, one or more of the example capacitors 110, 112 of FIG. 1. The example isolation circuit 700 does not include the example CMT detection circuit 120 and/or the example CMT rejection circuit 122 of FIGS. 1-3. Accordingly, positive and/or negative spikes at the inputs of the example receiver 702 correspond to false glitches at the output of the example demodulator 118 that do not match the input data that the transmitter 102 transmits. Accordingly, the example isolation circuit 700 may output inaccurate data as the result of a CMT event that causes a positive and/or negative spike at the input nodes of the receiver 702.

Figure 8A:
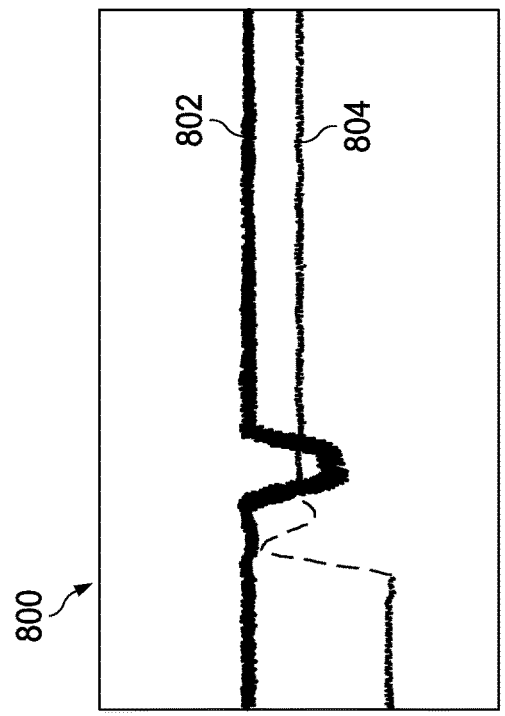
FIGS. 8A-8B are timing diagrams representative of outputs of the example receiver of FIG. 7 in response to a common-mode transient event.
Figure 8B:
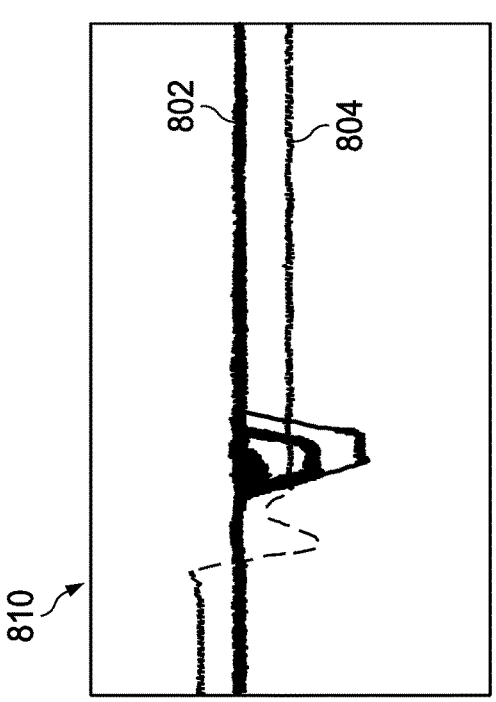

FIGS. 8A and 8B illustrate graphs 800, 810 of a response to a CMT event using the example isolation circuit 700 of FIG. 7. The example graphs 800, 810 include an example output voltage 802 (e.g., corresponding to the output of the example demodulator 118 of FIG. 7) and an example transmitter ground voltage 804 (e.g., corresponding to the ground reference of the example transmitter 102 of FIG. 7). The example graph 800 of FIG. 8A illustrates a CMT event corresponding to the example transmitter ground voltage 804 transitioning from a first voltage to a second higher voltage. As a result of the transition, the example output voltage 802 glitches by decreasing to a lower voltage for a short duration of time, even though the input data corresponds to the output voltage 802 has not changed. The example graph 810 of FIG. 8B illustrates a CMT event corresponding to the example transmitter ground voltage 804 transitioning from a first voltage to a second lower voltage. As a result of the transition, the example output voltage 802 glitches by decreasing to a lower voltage for a short duration of time, even though the input data correspond to the output voltage 802 has not changed. Accordingly, FIGS. 8A and 8B illustrate the example isolation circuit 700 of FIG. 7 outputting an undesired glitch at the output voltage 804 as a result of a CMT event.

Figure 9A:
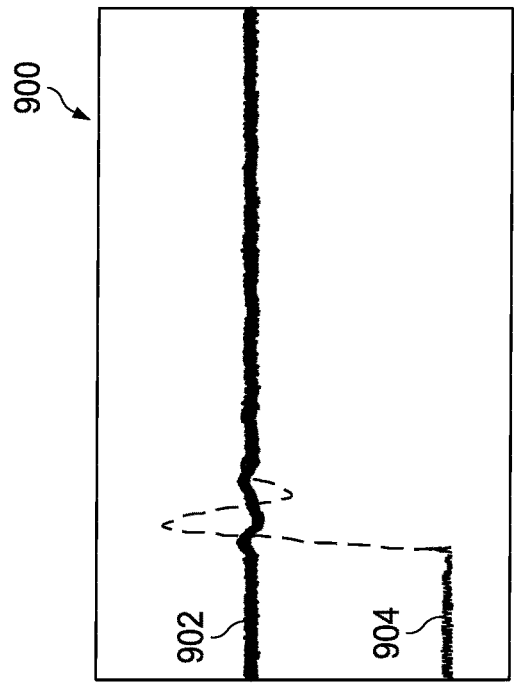
Figure 9B:
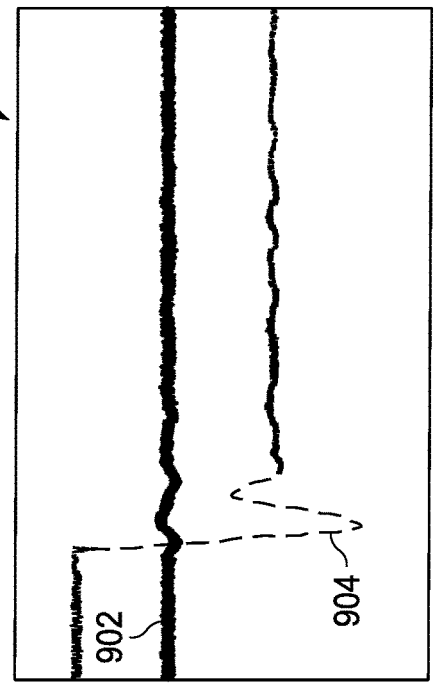

FIGS. 9A and 9B illustrate graphs 900, 910 of a response to a CMT event using the example isolation circuit 100 of FIG. 1. The example graphs 900, 910 include an example output voltage 902 (e.g., corresponding to the output of the example CMT rejection circuit 122 of FIG. 1) and an example transmitter ground voltage 904 (e.g., corresponding to the ground reference of the example transmitter 102 of FIG. 1). The example graph 900 of FIG. 9A illustrates a CMT event corresponding to the example transmitter ground voltage 904 transitioning from a first voltage to a second higher voltage. As a result of the transition, the example CMT detection circuit 120 detects the CMT event and the example CMT rejection circuit 122 rejects the CMT-based glitch by blocking the ongoing output of the demodulator 118 for a duration of time in response to the CMT detection circuit 120 detecting the event. Advantageously, the example output voltage 902 does not glitch. The example graph 910 of FIG. 9B illustrates a CMT event corresponding to the example transmitter ground voltage 904 transitioning from a first voltage to a second lower voltage. As a result of the transition, the example CMT detection circuit 120 detects the CMT event and the example CMT rejection circuit 122 rejects the CMT-based glitch by blocking the ongoing output of the demodulator 118 for a duration of time in response to the CMT detection circuit 120 detecting the event. Advantageously, the example output voltage 902 does not glitch. Accordingly, FIGS. 9A and 9B illustrate the example isolation circuit 100 of FIG. 1 rejecting the glitch illustrated FIGS. 8A and 8B.

FIGS. 9C and 9D illustrate graphs 920, 930 of a response to a CMT event using the example isolation circuit 100 of FIG. 1. The example graphs 920 of FIG. 9C includes an example receiver ground voltage 922 (e.g., corresponding to the RGND of FIG. 1), an example input (Vip) node voltage 924 (e.g., corresponding to the voltage at node Vip of FIG. 1), and an example detection signal 926 corresponding to the output of the example CMT detection circuit 120 of FIG. 1. The example graphs 930 of FIG. 9D includes an example receiver ground voltage 932 (e.g., corresponding to the RGND of FIG. 1), an example input (Vip) node voltage 934 (e.g., corresponding to the voltage at node Vip of FIG. 1), and an example detection signal 936 corresponding to the output of the example CMT detection circuit 120 of FIG. 1.

The example graphs 920, 930 of FIGS. 9C and 9D illustrate two CMT events caused by changes in the receiver ground (e.g., from a first voltage to a second voltage and from the second voltage back to the first voltage). The example graph 920 corresponds to a CMT event with a slower slew rate (e.g., 200 Volts (V)/nanosecond (ns)) than the example graph 930 (e.g., 800 V/ns). Accordingly, the example CMT event corresponding to the example graph 920 has less ringing than the example CMT event corresponding to the example graph 930. As shown in the example graphs 920, 930, the CMT event corresponding to the RGND 922, 932 results in positive and negative voltage spikes at the example input node voltages 924, 934, which results in the example CMT detection circuit 120 triggering a high voltage for the example detection voltage 926, 936, as described above in conjunction with FIGS. 1 and/or 2.

Figure 9E:
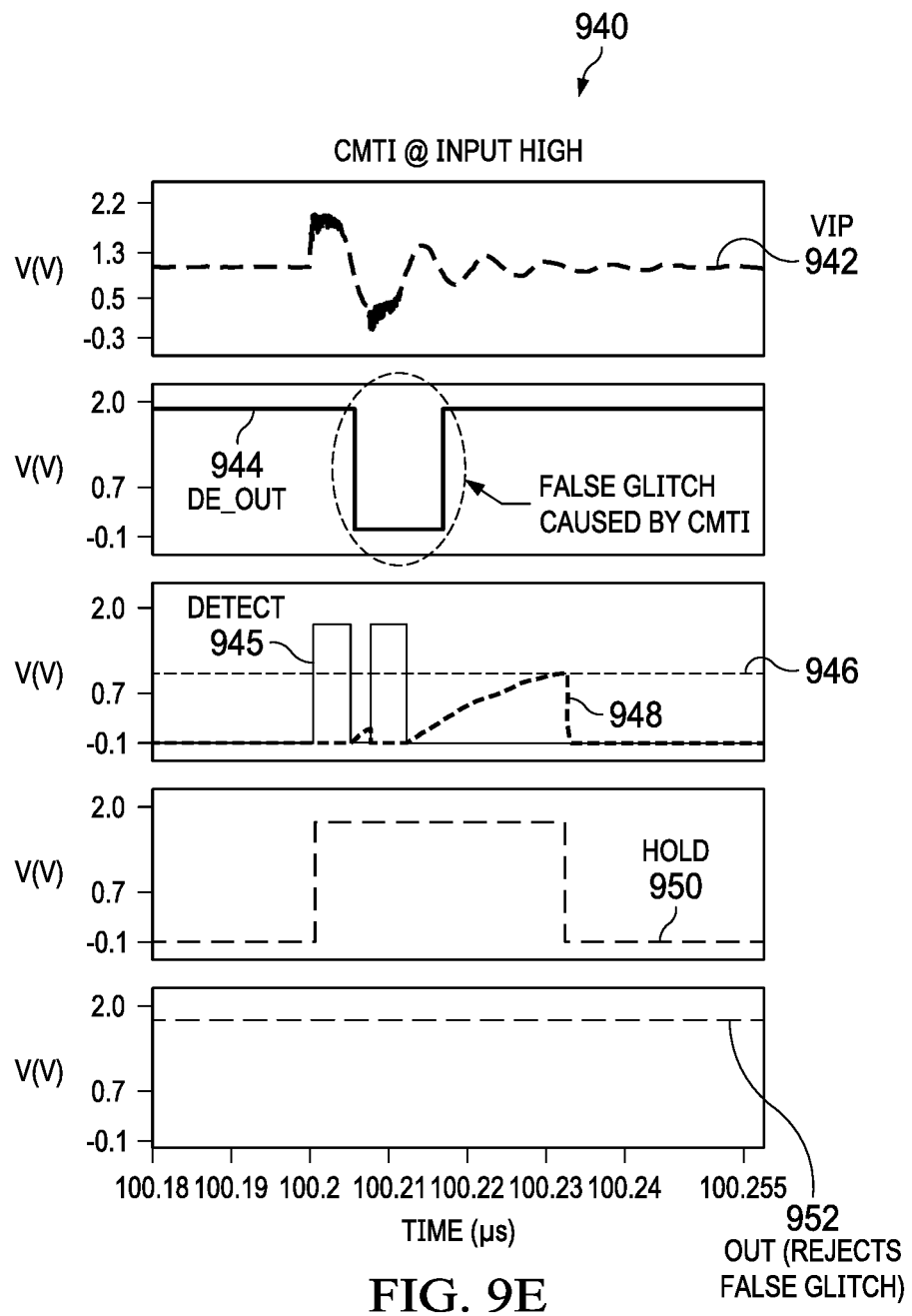

FIG. 9E illustrate an example graph 940 of a response to a CMT event using the example isolation circuit 100 of FIG. 1. The example graphs 940 of FIG. 9E includes an example input voltage (Vip) 942, and example demodulator output voltage 944 (e.g., corresponding to the output of the example demodulator 118 of FIG. 1), an example detection voltage 945 (e.g., corresponding to the output of the example CMT detection circuit 120 of FIGS. 1 and/or 2), an example voltage threshold 946 (e.g., corresponding to the threshold voltage of the example buffer 316 of the example stretch circuit 308 of FIG. 3), an example capacitor voltage 948 (e.g., corresponding to the voltage across the example capacitor 314 and at the input of the example buffer 316 of FIG. 3), an example hold/block voltage 950 (e.g., corresponding to the output of the example flip flop 300), and an example output voltage 952 (e.g., corresponding to the output of the example multiplexer 304 of the example CMT rejection circuit 122).

As shown in the example graph 940 of FIG. 9E, the example input voltage 942 spikes as a result of a CMT event. Accordingly, the example CMT detection circuit 120 triggers the detection voltage 945 to a high voltage to initiate the hold/block voltage 950 to go high. Once the hold/block voltage 950 goes high, the example demodulator output 944 is stored in the example flip flop 302 and held as the output voltage 952 until the hold/block voltage 950 drops back to a low voltage. As the input voltage 942 continues to vary (e.g., ring) in response to the CMT event, the example detection signal 945 toggles on and off twice. As described above in conjunction with FIG. 3, when the detection signal goes from a high voltage to a low voltage, the example switch 310 is enabled to charge the example capacitor 314, thereby increasing the example capacitor voltage 948 seen at the input of the example buffer 316. Once the example capacitor voltage 948 reaches the threshold voltage 946, the example buffer 316 triggers a reset of the example flip flop 300, thereby causing the example hold/block voltage 950 to drop to a low voltage and cause the example multiplexer 304 to output the demodulator output 944 as the output 952. In this manner, the example multiplexer 304 outputs the demodulator output 944 as the output voltage 952 while the hold/block voltage 950 is low and blocks the ongoing demodulator output 944 when the hold/block voltage 950 goes high, thereby avoiding the glitch on the example demodulator output 944 caused by the CMT event.

Figure 10:
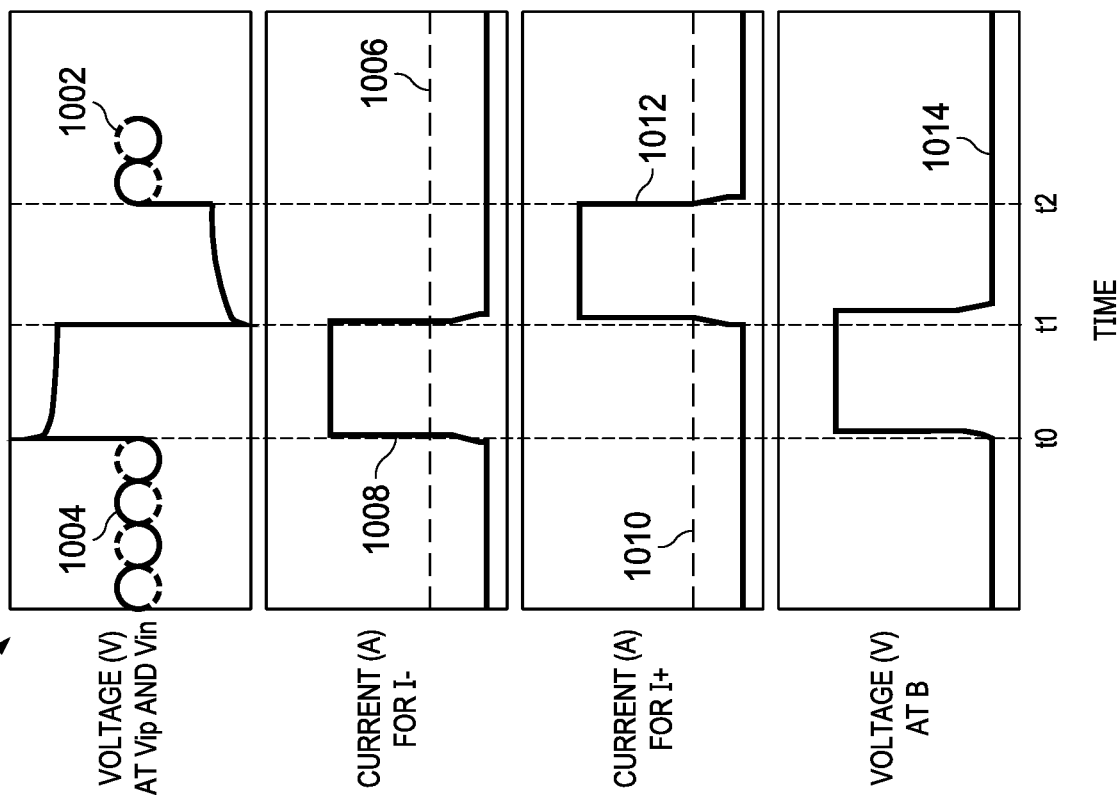
FIG. 10 illustrates timing diagrams representative of voltages and/or currents at different nodes of the example circuit of FIG. 2.

FIG. 10 illustrates example timing diagrams 1000 representative of currents and/or voltages at different nodes of the example circuit of FIG. 2 in response to a CMT event. FIG. 10 includes an example Vip voltage signal 1002 (e.g., representative of the voltage at the Vip node of FIG. 2), an example Vin voltage signal 1004 (e.g., representative of the voltage at the Vin node of FIG. 2), an example first reference current 1006 (e.g., representative of the current from the example current source 222 of FIG. 2), an example I− current signal 1008 (e.g., representative of the current I− of FIG. 2), an example second reference current 1010 (e.g., representative of the current from the example current source 220 of FIG. 2), an example I+ current signal 1008 (e.g., representative of the current I+ of FIG. 2), an example B voltage signal 1014 (e.g., representative of the voltage at node B of FIG. 2), an example A voltage signal 1016 (e.g., representative of the voltage at node A of FIG. 2), an example B' voltage signal 1018 (e.g., representative of the voltage at node B' of FIG. 2), an example A' voltage signal 1020 (e.g., representative of the voltage at node A' of FIG. 2), and an example detect voltage 1022 (e.g., representative of the voltage at the detect node of FIG. 2).

Prior to time 0 of FIG. 10, the example Vip and Vin signals 1002, 1004 operate with respect to a constant common mode. At time t0, the example Vip and Vin signal 1002, 1004 receive a high voltage pulse followed by a low voltage pulse as the result of a CMT event. Accordingly, the example clamp 114 clamps the Vip and Vin signals 1002, 1004, causing the example switches 208, 212 of FIG. 2 to turn on, thereby increasing the I− current 1008 (e.g., representative of the current being drawn by the example switches 208, 212) from a low current (e.g., 0 Amperes (A)) to a higher current. Once the I− current 1008 is above the reference current 1006, the example B node voltage 1014 is pulled to a high voltage from a low voltage. Accordingly, the output of the example buffer 226 goes high, as shown in the example B' voltage signal 1018.

At time t1, the example Vip and Vin signals 1002, 1004 receive a low voltage pulse as the result of the CMT event. Accordingly, the example clamp 114 clamps the Vip and Vin signals 1002, 1004, causing the example switches 210, 214 of FIG. 2 to turn on, thereby increasing the I+ current 1012 (e.g., representative of the current being drawn by the example switches 210, 214) from a low current (e.g., 0 Amperes (A)) to a higher current. Once the I+ current 1012 is above the reference current 1010, the example A node voltage 1016 is pulled to a low voltage from a high voltage. Accordingly, the output of the example inverter 224 goes high, as shown in the example A' voltage signal 1020.

At time t2, the pulses on the example Vip and Vin signals 1002, 1004 cease and the carrier signal waves continues. Accordingly, the example clamp 114 ceases the clamping the example Vip and Vin signals 1002, 1004. Thus, the example switches 208, 210, 212, 214 turn off (or remain off) thereby causing the example I− and I+ currents 1008, 1012 to go to a low current (or remain at the low current). Additionally after time t2, the B node voltage 1014 is being pulled low and the A node voltage 1016 is being pulled high. Thus, the example B' and A' voltage signals 1018, 1020 are both low. As described above in conjunction with FIG. 2, the example OR gate 228 performs a logic OR function based on the outputs of the example inverter 224 and the example buffer 226. Thus, the example detect signal 1022 is low when the B' voltage 1018 and the A' voltage 1020 are low (e.g., before time t0 and after time t2) and the example detect signal 1022 is high when one or more of the B' voltage 1018 or the A' voltage 1020 are high (e.g., between times t0 and t2).

Figure 11A:
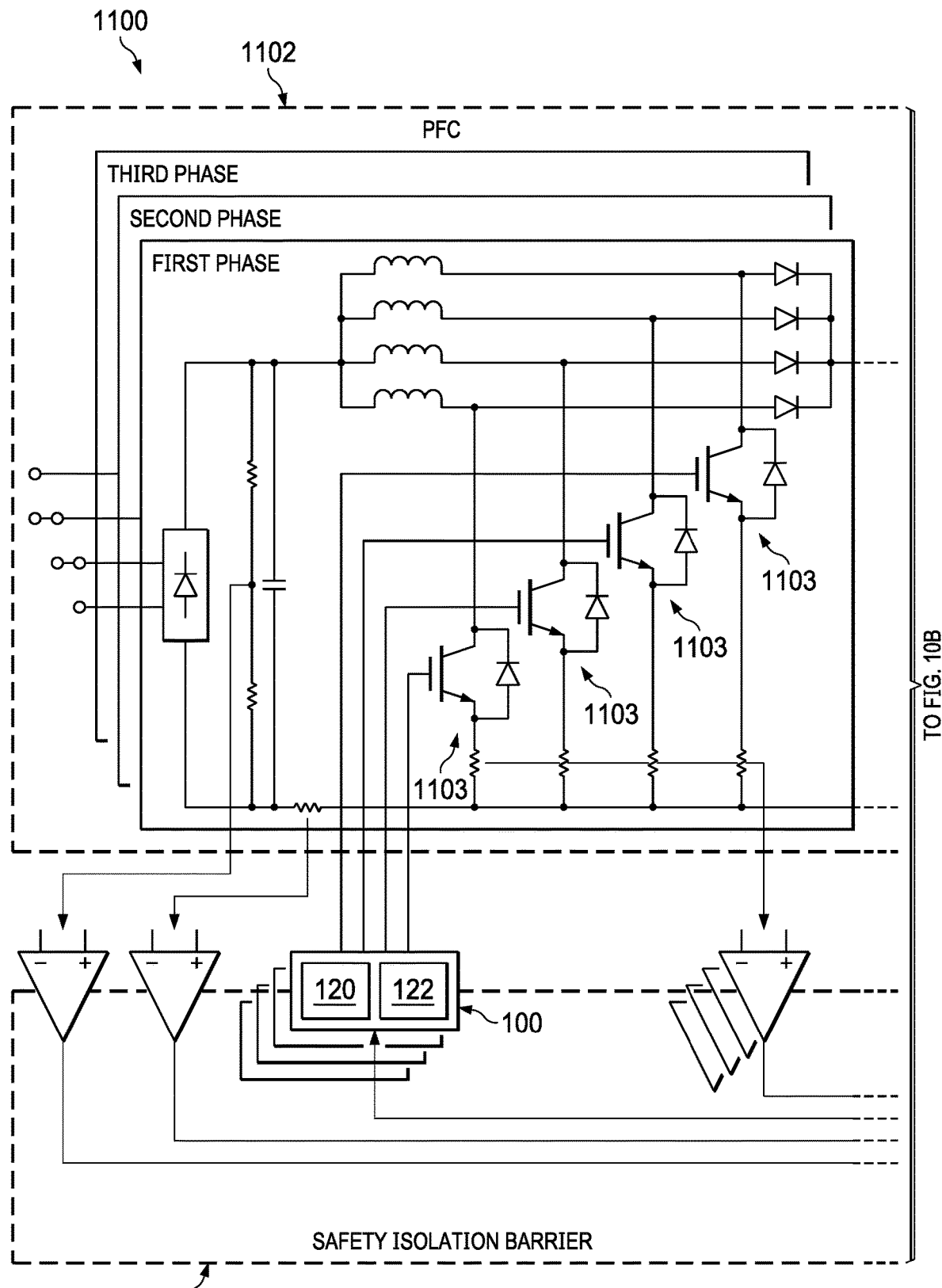
FIGS. 11A-11B is an example electric vehicle charging station system utilizing the example receiver of FIG. 1.
Figure 11B:
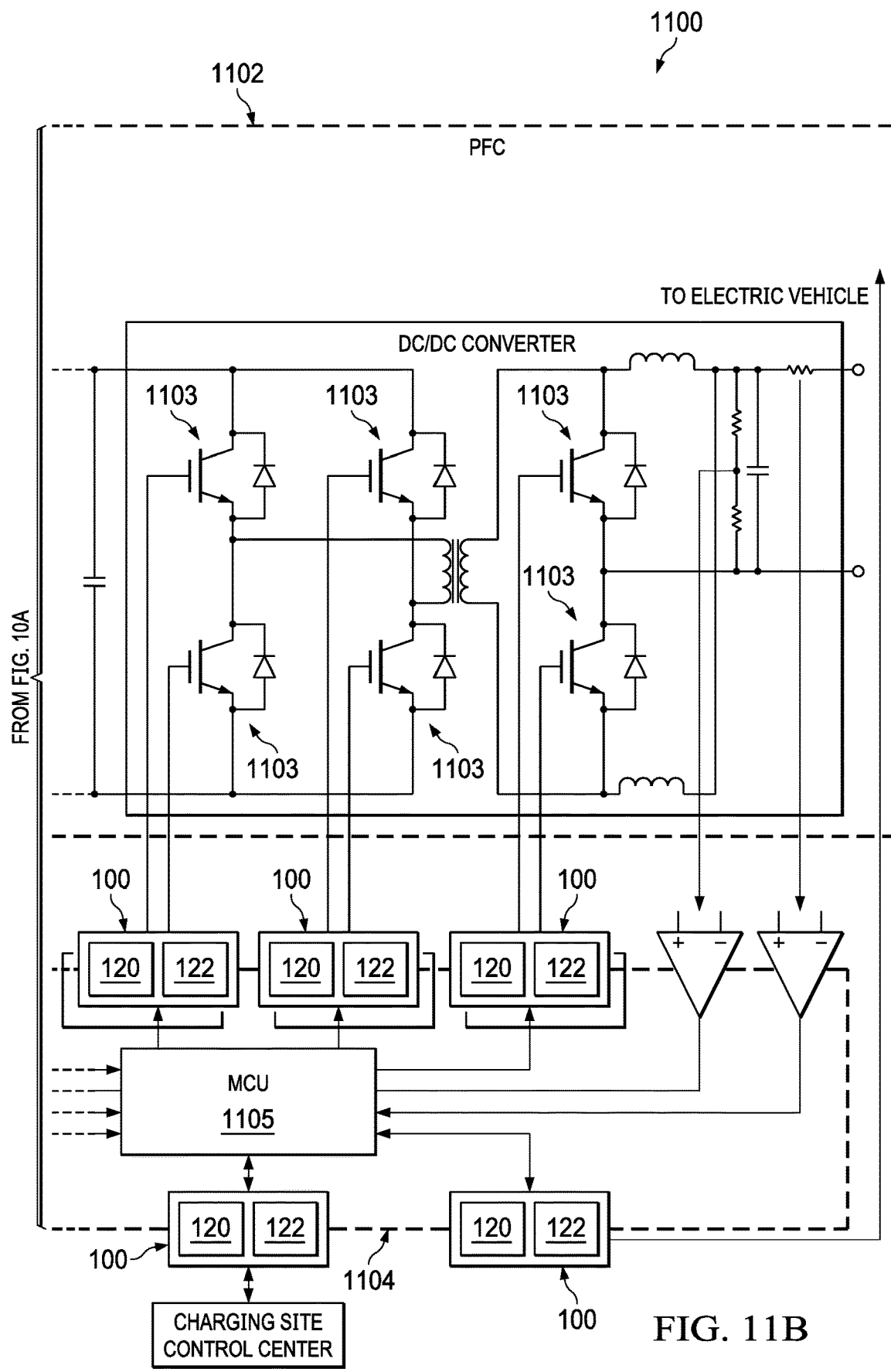

FIGS. 11A-11B is an example system 1100 (e.g., an electric vehicle charging station) including a first example stage 1102 (e.g., a high-voltage stage) and a second example stage 1104 (e.g., a low-voltage stage) connected via the example isolation circuit 100 of FIG. 1. In the example system 1100, an example microcontroller 1105 of the second example stage 1104 controls (e.g., using a control signal such as a pulse width modulation (PWM) signal(s)) example high-voltage power switch(es) 1103 (e.g., control metal oxide semiconductor field effect transistors (MOSFETs), insulated-gate bipolar transistors (IGBTs), gallium nitride (GaN) transistors, silicon carbide (SiC) transistors, etc.) of the first stage 1102 by transmitting a PWM signal to the gates the how power switch(es) via the example isolation circuit 100. The example isolation circuit 100 provides reinforced reliability and safety insulation capacity for gate driving, current/voltage sensing, digital communication, etc. The example isolation circuit 100 provides a safety isolation barrier between the first example stage 1102 (e.g., a high-voltage section) and the second example stage 1104 (e.g., a low-voltage section). The example first stage 1102 includes a power factor correction circuit (e.g., including various components such as the switches 1103, diodes, inductors, capacitors, and resistors) and a DC/DC power converter including resistors, inductors, a capacitor and the example switches 1103. The example isolation circuit 100 includes the example CMT detection circuit 120 and the CMT rejection circuit 122 to avoid and/or otherwise reduce glitches cause by CMT events, as further described above. Additionally, the example isolation circuit 100 may be used as opto-emulated isolators to provide an isolation layer between the second stage 1104 and other stages (e.g., the charging site control center, the electric vehicle, etc.). Additionally, the first stage 1102 may provide voltage and/or current information to the example controller 1105 via other components such as voltage sensors and/or current sensors.

From the foregoing, it will be appreciated that example methods, apparatus, and articles of manufacture increase common-mode transient immunity in isolation devices. Examples disclosed herein detect a CMT event corresponding to an isolation device based on current through a clamp of the isolation device and output a previous demodulator output and block the ongoing demodulator output for a duration of time after detecting the CMT event to avoid CMT-based glitches in the output of the demodulator. Accordingly, examples disclosed herein provide an improvement to previous isolation devices during CMT events.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
   a current mirror including an input terminal and an output terminal;
   a transistor including a gate terminal, a first current terminal, and a second current terminal, the gate terminal coupled to a reference voltage terminal, the first current terminal coupled to the input terminal of the current mirror, and the second current terminal coupled to an input node;
   a buffer including an input terminal and an output terminal, the input terminal of the buffer coupled to the output terminal of the current mirror; and
   a logic gate including an input terminal and an output terminal, the input terminal of the logic gate coupled to the output terminal of the buffer.

2. The apparatus of claim 1, wherein the current mirror is a first current mirror and the transistor is a first transistor, further including:
   a second current mirror including an input terminal and an output terminal;
   a second transistor including a gate terminal, a first current terminal, and a second current terminal, the gate terminal of the second transistor coupled to the reference voltage terminal, the first current terminal of the second transistor coupled to the input terminal of the second current mirror, and the second current terminal of the second transistor coupled to the input node; and
   an inverter including an input terminal and an output terminal, the input terminal of the inverter coupled to the output terminal of the second current mirror.

3. The apparatus of claim 2, wherein the first transistor is an n-channel transistor and the second transistor is a p-channel transistor.

4. The apparatus of claim 2, wherein the input terminal of the logic gate is a first input terminal, the logic gate further including a second input terminal coupled to the output terminal of the inverter.

5. The apparatus of claim 4, further including a common-mode transient (CMT) rejection circuit including:
   a first flip flop including a set terminal and an output terminal, the set terminal coupled to the output terminal of the logic gate;
   a second flip flop including a clock terminal, a data terminal, and an output terminal, the clock terminal coupled to the output terminal of the first flip flop and the data terminal coupled to a demodulator output terminal of a demodulator; and
   a multiplexer including a first input terminal, an second input terminal, and a select terminal, the first input terminal of the multiplexer coupled to the output terminal of the second flip flop, the second input terminal of the multiplexer coupled to the demodulator output terminal of the demodulator, and the select terminal coupled to the output terminal of the first flip flop.

6. The apparatus of claim 5, wherein the first flip flop includes a reset terminal and an inverted output terminal, and the logic gate is a first logic gate, further including a second logic gate including a first input terminal, a second input terminal, and an output terminal, the first input terminal if the second logic gate coupled to the output terminal of the first logic gate and the second input terminal is coupled to the inverted output terminal of the first flip flop.

7. The apparatus of claim 6, wherein the CMT rejection circuit includes a stretching circuit including an input terminal and an output terminal, the input terminal of the stretching circuit coupled to the output terminal of the second logic gate and the output terminal of the stretching circuit coupled to the reset terminal of the first flip flop.

8. The apparatus of claim 7, wherein the buffer is a first buffer, the stretching circuit including:
   a third transistor including a gate terminal, a first current terminal, and a second current terminal, the gate terminal of the third transistor coupled to the output terminal of the second logic gate and the first current terminal coupled to a voltage source;
   a fourth transistor including a gate terminal, a first current terminal, and a second current terminal, the gate terminal of the fourth transistor coupled to the output terminal of the second logic gate, the first current terminal of the fourth transistor coupled to the second current terminal of the third transistor, and the second current terminal of the fourth transistor coupled to ground;
   a capacitor coupled to the second current terminal of the third transistor, the first current terminal of the fourth transistor, and ground; and
   a second buffer including an input terminal and an output, the input terminal of the second buffer coupled to the capacitor, the second current terminal of the third transistor, and the first current terminal of the fourth transistor, and the output of the second buffer is coupled to the reset terminal of the first flip flop.

9. An apparatus comprising:
   a first flip flop including a set terminal and an output terminal, the set terminal coupled to an output terminal of a logic gate;
   a second flip flop including a clock terminal, a data terminal, and an output terminal, the clock terminal coupled to the output terminal of the first flip flop and the data terminal coupled to a demodulator output terminal of a demodulator; and a multiplexer including a first input terminal, a second input terminal, and a select terminal, the first input terminal of the multiplexer coupled to the output terminal of the second flip flop, the second input terminal of the multiplexer coupled to the demodulator output terminal of the demodulator, and the select terminal coupled to the output terminal of the first flip flop.

10. The apparatus of claim 9, wherein the first flip flop includes a reset terminal and an inverted output terminal, and the logic gate is a first logic gate, further including a second logic gate including a first input terminal, a second input terminal, and an output terminal, the first input terminal if the second logic gate coupled to the output terminal of the first logic gate and the second input terminal is coupled to the inverted output terminal of the first flip flop.

11. The apparatus of claim 10, further including a stretching circuit including an input terminal and an output terminal, the input terminal of the stretching circuit coupled to the output terminal of the second logic gate and the output terminal of the stretching circuit coupled to the reset terminal of the first flip flop.

12. The apparatus of claim 11, wherein the stretching circuit includes:
a first transistor including a gate terminal, a first current terminal, and a second current terminal, the gate terminal of the first transistor coupled to the output terminal of the second logic gate and the first current terminal coupled to a voltage source;
a second transistor including a gate terminal, a first current terminal, and a second current terminal, the gate terminal of the second transistor coupled to the output terminal of the second logic gate, the first current terminal of the second transistor coupled to the second current terminal of the first transistor, and the second current terminal of the second transistor coupled to ground;
a capacitor coupled to the second current terminal of a third transistor, the first current terminal of a fourth transistor, and ground; and
a buffer including an input terminal and an output, the input terminal of the buffer coupled to the capacitor, the second current terminal of the third transistor, and the first current terminal of the fourth transistor, and the output of the buffer is coupled to the reset terminal of the first flip flop.

13. The apparatus of claim 9, wherein the output terminal of the logic gate is an output terminal of a common-mode transient detection circuit including an input terminal coupled to an isolation device.

14. An apparatus comprising:
a common-mode transient (CMT) detection circuit coupled to an input node and a clamp, the CMT detection circuit to detect a CMT event at the input node; and
a CMT rejection circuit coupled to the CMT detection circuit and a demodulator, the CMT detection circuit to, in response to the detection of the CMT event, block an output of the demodulator for a threshold amount of time.

15. The apparatus of claim 14, wherein the CMT detection circuit is configured to detect the CMT event at the input node by sensing a current through current terminals of a switch to clamp a voltage at the input node.

16. The apparatus of claim 15, wherein the CMT detection circuit is configured to compare the current to a reference current, the CMT detection circuit to detect the CMT event based on the current being above the reference current.

17. The apparatus of claim 14, wherein the CMT detection circuit is configured to detect the CMT event at the input node by detecting a voltage spike at the input node.

18. The apparatus of claim 14, wherein the CMT rejection circuit is configured to:
in response to receiving a signal from the CMT rejection circuit identifying the CMT event, store the output of the demodulator; and
output the stored output of the demodulator for the threshold amount of time.

19. The apparatus of claim 18, the CMT rejection circuit is configured to output the stored output of the demodulator and discard a present output of the demodulator for the threshold amount of time.

20. The apparatus of claim 14, wherein the CMT detection circuit is configured to, in response to determining that the CMT event has ended, transmit an end signal identifying an end of the CMT event, the threshold amount of time corresponding to an amount of time after the end signal was transmitted.

21. The apparatus of claim 20, wherein the CMT rejection circuit is configured to, after the threshold amount of time, discard a stored demodulator output and output a present demodulator output.

22. The apparatus of claim 20, wherein the threshold amount of time corresponds to a capacitance of a capacitor and a threshold voltage of a buffer.

23. The apparatus of claim 14, wherein the threshold amount of time corresponds to an amount of time after the CMT event ceases.

24. A system comprising:
a high-voltage stage including a high-voltage power switch;
a low-voltage stage including a controller to transmit a control signal to a gate terminal of the high-voltage power switch; and
an isolation device having a transmitter, a receiver, and an isolation barrier coupled between the high-voltage stage and the low-voltage stage;
the transmitter configured to:
modulate the control signal into a carrier signal;
transmit the carrier signal through the isolation barrier to the receiver;
the receiver configured to:
demodulate the carrier signal;
in response to determining a common-mode transient (CMT) event, store an output of a demodulator and block an ongoing output of the demodulator; and
transmit the stored output of the demodulator to the gate terminal of the high-voltage power switch.

25. The system of claim 24, wherein the isolation barrier is at least one of a capacitive isolation barrier, an inductive isolation barrier, an optocoupled isolation barrier.

26. The system of claim 24, wherein the high-voltage power switch is at least one of an insulated-gate bipolar transistor, a gallium nitride transistor, or a silicon carbide transistors.

* * * * *